US009035354B2

(12) United States Patent
Saxler et al.

(10) Patent No.: US 9,035,354 B2
(45) Date of Patent: *May 19, 2015

(54) HETEROJUNCTION TRANSISTORS HAVING BARRIER LAYER BANDGAPS GREATER THAN CHANNEL LAYER BANDGAPS AND RELATED METHODS

(75) Inventors: Adam William Saxler, Durham, NC (US); Yifeng Wu, Goleta, CA (US); Primit Parikh, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/566,973

(22) Filed: Sep. 25, 2009

(65) Prior Publication Data

US 2010/0187570 A1    Jul. 29, 2010

Related U.S. Application Data

(60) Division of application No. 11/357,752, filed on Feb. 17, 2006, now Pat. No. 7,612,390, which is a continuation-in-part of application No. 10/772,882, filed on Feb. 5, 2004, now Pat. No. 7,170,111.

(51) Int. Cl.
*H01L 29/778* (2006.01)
*H01L 29/20* (2006.01)
*H01L 29/66* (2006.01)
(Continued)

(52) U.S. Cl.
CPC ........ *H01L 29/7785* (2013.01); *H01L 29/2003* (2013.01); *H01L 29/207* (2013.01); *H01L 29/66462* (2013.01); *H01L 29/7783* (2013.01); *H01L 29/802* (2013.01)

(58) Field of Classification Search
USPC .......................................... 257/194
See application file for complete search history.

(56) References Cited

U.S. PATENT DOCUMENTS

| 2,938,136 A | 5/1960 | Fischer |
| 4,152,618 A | 5/1979 | Abe et al. |
| 4,168,102 A | 9/1979 | Chida et al. |

(Continued)

FOREIGN PATENT DOCUMENTS

| EP | 0 563 847 A2 | 10/1993 |
| EP | 0 334 006 | 9/1999 |

(Continued)

OTHER PUBLICATIONS

Chang et al., *AlGaN/GaN Modulation-Doped Field-Effect Transistors with An Mg-doped Carrier Confinement Layer*, Japanese Journal of Applied Physics, vol. 42 (2003) pp. 3316-3319 Part 1, No. 6A, Jun. 2003, XP-001192019.

(Continued)

*Primary Examiner* — Jerome Jackson, Jr.
(74) *Attorney, Agent, or Firm* — Myers Bigel Sibley & Sajovec, P.A.

(57) ABSTRACT

A heterojunction transistor may include a channel layer comprising a Group III nitride, a barrier layer comprising a Group III nitride on the channel layer, and an energy barrier comprising a layer of a Group III nitride including indium on the channel layer such that the channel layer is between the barrier layer and the energy barrier. The barrier layer may have a bandgap greater than a bandgap of the channel layer, and a concentration of indium (In) in the energy barrier may be greater than a concentration of indium (In) in the channel layer. Related methods are also discussed.

33 Claims, 20 Drawing Sheets

(51) Int. Cl.
*H01L 29/207* (2006.01)
*H01L 29/80* (2006.01)

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hilda et al. | |
| 4,755,867 A | 7/1988 | Cheng | |
| 4,788,156 A | 11/1988 | Stoneham et al. | |
| 4,946,547 A | 8/1990 | Palmour et al. | |
| 5,006,914 A | 4/1991 | Beetz, Jr. | |
| 5,030,583 A | 7/1991 | Beetz, Jr. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,292,501 A | 3/1994 | Degenhardt et al. | |
| 5,296,395 A | 3/1994 | Khan et al. | |
| 5,298,445 A | 3/1994 | Asano | |
| 5,311,055 A | 5/1994 | Goodman et al. | |
| 5,373,171 A | 12/1994 | Imai et al. | |
| 5,382,822 A | 1/1995 | Stein | |
| RE34,861 E | 2/1995 | Davis et al. | |
| 5,389,571 A | 2/1995 | Takeuchi et al. | |
| 5,393,993 A | 2/1995 | Edmond et al. | |
| 5,422,901 A | 6/1995 | Lebby et al. | |
| 5,523,589 A | 6/1996 | Edmond et al. | |
| 5,534,462 A | 7/1996 | Fiordalice et al. | |
| 5,592,501 A | 1/1997 | Edmond et al. | |
| 5,661,312 A | 8/1997 | Weitzel et al. | |
| 5,686,737 A | 11/1997 | Allen | |
| 5,700,714 A | 12/1997 | Ogihara et al. | |
| 5,701,019 A | 12/1997 | Matsumoto et al. | |
| 5,705,827 A | 1/1998 | Baba et al. | |
| 5,804,482 A | 9/1998 | Konstantinov et al. | |
| 5,872,415 A | 2/1999 | Dreifus et al. | |
| 5,885,860 A | 3/1999 | Weitzel et al. | |
| 5,929,467 A | 7/1999 | Kawai et al. | |
| 5,946,547 A | 8/1999 | Kim et al. | |
| 5,990,531 A | 11/1999 | Taskar et al. | |
| 6,028,328 A | 2/2000 | Riechert et al. | |
| 6,046,464 A | 4/2000 | Schetzina | |
| 6,064,082 A | 5/2000 | Kawai et al. | |
| 6,086,673 A | 7/2000 | Molnar | |
| 6,150,239 A | 11/2000 | Goesele et al. | |
| 6,150,680 A | 11/2000 | Eastman et al. | |
| 6,156,581 A | 12/2000 | Vaudo et al. | |
| 6,177,685 B1 | 1/2001 | Teraguchi | |
| 6,218,680 B1 | 4/2001 | Carter, Jr. et al. | |
| 6,316,793 B1 | 11/2001 | Sheppard et al. | |
| 6,316,826 B1 | 11/2001 | Yamamoto et al. | |
| 6,396,864 B1 | 5/2002 | O'Brien et al. | |
| 6,429,467 B1 | 8/2002 | Ando | |
| 6,448,648 B1 | 9/2002 | Boos | |
| 6,492,669 B2 | 12/2002 | Nakayama et al. | |
| 6,497,763 B2 | 12/2002 | Kub et al. | |
| 6,515,316 B1 | 2/2003 | Wojtowicz et al. | |
| 6,533,874 B1 | 3/2003 | Vaudo et al. | |
| 6,548,333 B2 | 4/2003 | Smith | |
| 6,583,454 B2 | 6/2003 | Sheppard et al. | |
| 6,586,781 B2 | 7/2003 | Wu et al. | |
| 6,624,452 B2 * | 9/2003 | Yu et al. | 257/194 |
| 6,634,770 B2 | 10/2003 | Cao | |
| 6,639,255 B2 | 10/2003 | Inoue et al. | |
| 6,670,693 B1 | 12/2003 | Quick | |
| 6,686,676 B2 | 2/2004 | McNulty et al. | |
| 6,692,568 B2 | 2/2004 | Cuomo et al. | |
| 6,757,314 B2 | 6/2004 | Kneissl et al. | |
| 6,867,067 B2 | 3/2005 | Ghyselen et al. | |
| 7,033,912 B2 | 4/2006 | Saxler | |
| 7,042,153 B2 | 5/2006 | Uemura | |
| 7,045,404 B2 | 5/2006 | Sheppard | |
| 7,084,441 B2 | 8/2006 | Saxler | |
| 7,135,715 B2 | 11/2006 | Saxler | |
| 7,161,194 B2 | 1/2007 | Parikh | |
| 7,238,560 B2 | 7/2007 | Sheppard | |
| 7,332,795 B2 | 2/2008 | Smith | |
| 7,355,215 B2 | 4/2008 | Parikh | |
| 7,432,142 B2 | 10/2008 | Saxler | |
| 7,456,443 B2 | 11/2008 | Saxler | |
| 7,465,967 B2 | 12/2008 | Smith | |
| 7,544,963 B2 | 6/2009 | Saxler | |
| 7,579,626 B2 | 8/2009 | Saxler | |
| 7,612,390 B2 * | 11/2009 | Saxler et al. | 257/194 |
| 2001/0015446 A1 | 8/2001 | Inoue et al. | |
| 2001/0020700 A1 | 9/2001 | Inoue et al. | |
| 2001/0023964 A1 | 9/2001 | Wu et al. | |
| 2001/0040246 A1 | 11/2001 | Ishii | |
| 2002/0008241 A1 | 1/2002 | Edmond et al. | |
| 2002/0017696 A1 | 2/2002 | Nakayama et al. | |
| 2002/0036287 A1 | 3/2002 | Yu et al. | |
| 2002/0066908 A1 | 6/2002 | Smith | |
| 2002/0078881 A1 | 6/2002 | Cuomo et al. | |
| 2002/0079508 A1 | 6/2002 | Yoshida | |
| 2002/0086534 A1 | 7/2002 | Cuomo et al. | |
| 2002/0088987 A1 | 7/2002 | Sakurai | |
| 2002/0096104 A1 | 7/2002 | Yagi et al. | |
| 2002/0096106 A1 | 7/2002 | Kub et al. | |
| 2002/0117695 A1 | 8/2002 | Borges et al. | |
| 2002/0119610 A1 | 8/2002 | Nishii et al. | |
| 2002/0123204 A1 | 9/2002 | Torvik | |
| 2002/0167023 A1 | 11/2002 | Chavarkar et al. | |
| 2002/0180351 A1 | 12/2002 | McNulty et al. | |
| 2002/0182779 A1 | 12/2002 | Bewley et al. | |
| 2003/0017683 A1 | 1/2003 | Emrick et al. | |
| 2003/0020092 A1 | 1/2003 | Parikh et al. | |
| 2003/0025198 A1 | 2/2003 | Chrysler et al. | |
| 2003/0096507 A1 | 5/2003 | Baker et al. | |
| 2003/0102482 A1 | 6/2003 | Saxler | |
| 2003/0107045 A1 | 6/2003 | Eisert et al. | |
| 2003/0123829 A1 | 7/2003 | Taylor | |
| 2003/0127654 A1 | 7/2003 | Eisert et al. | |
| 2003/0145784 A1 | 8/2003 | Thompson et al. | |
| 2003/0157776 A1 | 8/2003 | Smith | |
| 2003/0209714 A1 | 11/2003 | Taskar et al. | |
| 2003/0213975 A1 | 11/2003 | Hirose et al. | |
| 2003/0219959 A1 | 11/2003 | Ghyselen et al. | |
| 2004/0004223 A1 | 1/2004 | Nagahama et al. | |
| 2004/0009649 A1 | 1/2004 | Kub et al. | |
| 2004/0021152 A1 | 2/2004 | Nguyen et al. | |
| 2004/0023468 A1 | 2/2004 | Ghyselen et al. | |
| 2004/0029330 A1 | 2/2004 | Hussain et al. | |
| 2004/0051141 A1 | 3/2004 | Udrea | |
| 2004/0066908 A1 | 4/2004 | Hanke et al. | |
| 2004/0241970 A1 | 12/2004 | Ring | |
| 2005/0164482 A1 | 7/2005 | Saxler | |
| 2006/0017064 A1 | 1/2006 | Saxler | |
| 2006/0226412 A1 | 10/2006 | Saxler | |
| 2006/0226413 A1 | 10/2006 | Saxler | |
| 2006/0244010 A1 | 11/2006 | Saxler | |

FOREIGN PATENT DOCUMENTS

| | | |
|---|---|---|
| JP | 63-009983 A | 1/1988 |
| JP | 3-227533 A | 10/1991 |
| JP | 3295267 | 12/1991 |
| JP | 7-022614 A | 1/1995 |
| JP | 10-050982 | 2/1998 |
| JP | 11-111730 | 4/1999 |
| JP | H 11204778 | 7/1999 |
| JP | 11-251638 | 9/1999 |
| JP | 11261053 | 9/1999 |
| JP | 2000-068498 A | 3/2000 |
| JP | 2000-150538 A | 5/2000 |
| JP | 2001-127281 A | 5/2001 |
| JP | 02001230407 | 8/2001 |
| JP | 02002016087 | 1/2002 |
| JP | 2002265296 | 9/2002 |
| JP | 2003037074 | 2/2003 |
| JP | 2003257804 | 9/2003 |
| JP | 2003-282598 | 10/2003 |
| JP | 2004200248 | 7/2004 |

(56) References Cited

FOREIGN PATENT DOCUMENTS

| JP | 2004-342810 | | 12/2004 |
|---|---|---|---|
| JP | 2005-512327 | A | 4/2005 |
| JP | 2005-217049 | A | 8/2005 |
| JP | 2006004970 | | 1/2006 |
| JP | 2007-535138 | A | 11/2007 |
| WO | WO 93/23877 | A1 | 11/1993 |
| WO | WO 01/57929 | A1 | 8/2001 |
| WO | WO 03036699 | | 5/2003 |
| WO | WO 03/049193 | | 6/2003 |
| WO | WO 03/049193 | A1 | 6/2003 |
| WO | WO 2004/008495 | | 1/2004 |
| WO | WO 2005/024909 | | 3/2005 |
| WO | WO 2005/083793 | | 9/2005 |

OTHER PUBLICATIONS

Palacios et al., AlGaN/GaN High Electron Mobility Transistors With InGaN Back-Barriers, *IEEE Electron Device Letters*, vol. No. 1, Jan. 2006, XP-001237869, 3 pages.

EPO Communication pursuant to Article 94(3) EPC, Application No. 04785260.3-2203, Cree, Inc., Apr. 16, 2010, 5 pages.

EPO Communication pursuant to Article 94(3) EPC, Application No. 06126233.3-1235, Patent No. 1821344, Cree, Inc., Jun. 1, 2010, 1 page.

Celler et al. "Frontiers of Silicon-on-Insulator" *Journal of Applied Physics* 93(9): 4955 (2003).

Elhamri et al. "Persistent Photoconductivity in a High Mobility Two Dimensional Electron Gas in an AlGaN/GaN Heterostructure" *Materials Research Society Symposium Procedures* vol. 639 pp. G7.6.1-G7.6.6 (2001).

Gaskill et al. "Summary of the Workshop on Bonded Compliant Substrates" *MRS Internet Journal Nitride Semiconductor Research* 2 pages, Mar. 4, 1998.

Moriceau et al. "New Layer Transfers Obtained by the SmartCut Process" *Journal of Electronic Materials* 32(8): 829-835 (2003).

Palacios et al. "AlGaN/GaN HEMTs with an InGaN-Based Back-Barrier" *Device Research Conference Digest*, 2005. DRC '05. 63$^{rd}$ 1: 181-182 (2005).

Palacios et al. "AlGaN/GaN High Electron Mobility Transistors With InGaN Back-Barriers" *IEEE Electron Devices Letters* 27(1): 13-15 (2006).

Pribble et al. "Applications of SiC MESFETs and GaN HEMTs in Power Amplifier Design" *2002 IEEE MTT-S Digest* 30:1819-1822 (2002).

RadioElectronics.com "The High Electron Mobility Transistor (HEMT)" website. <http://www.radio-electronics.com/info/data.semicond.hemt/hemt.php> accessed on Nov. 2, 2005.

Sexier et al. Electroluminescence of III_Nitride Double Heterostructure Light Emitting Diodes with Silicon and Magnesium Doped InGaN *Materials Science Forum* vols. 258-263 pp. 1229-1234 (1997).

Asbeck et al. "Piezoelectric charge densities in AlGaN/GaN HFETs," *Electronics Letters*. vol. 33, No. 14, pp. 1230-1231, 1997.

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, Mar. 2001, pp. 479-485.

Gaska et al. "Electron Transport in AlGaN-GaN Heterostructures Grown on 6H-SiC Substrates," Appl.Phys.Lett., 72, 707 (1998).

Gaska et al. "High-Temperature Performance of AlGaN/GaN HFET's on SiC Substrates," *IEEE Electron Device Letters*. vol. 18, No. 1, p. 492, Oct. 1997.

Gelmont et al. "Monte Carlo simulation of electron transport in gallium nitride," J.Appl.Phys. 74, 1818 (1993).

Heikman et al., Growth of Fe-Doped Semi-insulating GaN by Metalorganic Chemical Vapor Deposition, Appl. Phys. Let. 81, pp. 439-441 (2002).

Ping et al. "DC and Microwave Performance of High-Current AlGaN/GaN Heterostructure Field Effect Transistors Grown on P-Type SiC Substrates," *IEEE Electron Letters*. vol. 19, No. 2, p. 54, Feb. 1998.

Sheppard et al. "High Power Demonstration at 10 GHz with GaN/AlGaN HEMT Hybrid Amplifiers." Presented at the 58$^{th}$ DRC, Denver, CO, Jun. 2000.

Sheppard et al. "Improved 10-GHz Operation of GaN/AlGaN HEMTs on Silicon Carbide," *Materials Science Forum*. (2000) vols. 338-342, pp. 1643-1646.

Sheppard et al. U.S. Appl. No. 09/096,967 entitled, *Nitride Based Transistors on Semi-Insulating Silicon Carbide Substrates*, filed Jun. 12, 1998.

Sullivan et al. "High-Power 10-GHz Operation of AlGaN HFET's in Insulating SiC," *IEEE Electron Device Letters*. vol. 19, No. 6, p. 198, Jun. 1998.

Wu et al. "High Al-Content AlGaN/GaN MODFET's for Ultrahigh Performance," *IEEE Electron Device Letters*. vol. 19, No. 2, p. 50, Feb. 1998.

Yu et al. "Schottky barrier engineering in III-V nitrides via the piezoelectric effect," *Applied Physics Letters*. vol. 73, No. 13, pp. 1880-1882, Sep. 28, 1998.

International Search Report for PCT/US02/09398, Aug. 26, 2002.

Breitschadel et al., "Minimization of Leakage Current of Recessed Gate AlGaN/GaN HEMTs by Optimizing the Dry-Etching Process," *Journal of Electronic Materials*, vol. 28, No. 12 (1999).

Burm et al., "Recessed Gate GaN MODFETs," *Solid State Electronics*, vol. 41, No. 2, pp. 247-250 (1997).

Chen et al., "Reactive ion etching for gate recessing of AlGaN/GaN Field-effect transistors," *J. Vac. Sci. Technol. B*, vol. 17, No. 6, (1999).

Egawa et al., "Recessed gate AlGaN/GaN modulation-doped filed-effect transistors on sapphire," *Applied Physics Letters*, vol. 76, No. 1, pp. 121-123 (2000).

Heikman et al., "Polarization Effects in AlGaN/GaN and GaN/AlGaN/GaN heterostructures," *Journal of Applied Physics*, vol. 93, No. 12, pp. 10114-10118 (2003).

Heikman, Sten J., *MOCVD Growth Technologies for Applications in AlGaN/GaN High Electron Mobility Transistors*, Dissertation, University of California—Santa Barbara, 190 pages (2002).

Karmalkar et al., "Enhancement of Breakdown Voltage in AlGaN/GaN High Electron Mobility Transistors Using a Field Plate," *IEEE Transactions on Electron Devices*, vol. 48, No. 8 (2001).

Karmalkar of al., "Resurf AlGaN/GaN HEMT for High Voltage Power Switching," *IEEE Electron Device Letters*, vol. 22, No. 8, pp. 373-375 (2001).

Kuzmik et al., "Annealing of Schottky contacts deposited on dry etched AlGaN/GaN," *Semiconductor Science and Technology*, vol. 17, No. 11 (2002).

Neuburger et al. "Design of GaN-based Field Effect Transistor Structures based on Doping Screening of Polarization Fields," WA 1.5, 7$^{th}$ Wide-Bandgap III-Nitride Workshop, Mar. 2002.

Sriram et al., "RF Performance of AlGaN/GaN MODFET's on High Resistivity SiC Substrates," Presentation at Materials Research Society Fall Symposium, 1997.

Sriram et al., "SiC and GaN Wide Gandgap Microwave Power Transistors," *IEEE Sarnoff Symposium*, Mar. 18, 1998.

Wu et al., "30-W/mm AlGaN/GaN HEMTs by Field Plate Optimization," *IEEE Electron Device Letters* (2004).

Cho et al., "A New GaAs Field Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online No. 20030872*, 39(19), (Sep. 18, 2003).

Küsters et al., "Double-Heterojunction Lattice-Matched and Pseudomorphic InGaAs HEMT with δ-Doped InP Supply Layers and p-InP Barrier Enhancement Layer Grown by LP-MOVPE," *IEEE Electron Device Letters*, 14(1), (Jan. 1993).

Shiojima et al., "Improved Carrier Confinement by a Buried p-Layer in the AlGaN/GaN HEMT Structure," *IEICE Trans. Electron.*, E83-C(12), (Dec. 2000).

International Search Report and Written Opinion of the International Searching Authority for PCT US2004/031984; date of mailing Jan. 21, 2005.

(56) References Cited

OTHER PUBLICATIONS

Ando et al., "10-W/mm AlGaN-GaN HFET With a Field Modulating Plate," *IEEE Electron Device Letters*, 24(5), pp. 289-291 (May 2003).
Chini et al., "Power and Linearity Characteristics of Field-Plagted Recessed-Gate AlGaN-GaN HEMTs," *IEEE Electron Device Letters*, 25(5), pp. 229-231 (May 2004).
Gaska et al., "Self-Heating in High-Power AlGaN/GaN HFET's," *IEEE Electron Device Letters*, 19(3), pp. 89-91 (Mar. 1998).
Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).
Kanaev at al., "Femtosecond and Ultraviolet Laser Irradiation of Graphitelike Hexagonal Boron Nitride," *Journal of Applied Physics*, 96(8), pp. 4483-4489 (Oct. 15, 2004).
Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).
Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).
Kashahara et al., "Ka-ban 2.3W Power AlGaN/GaN Heterojunction FET," *IEDM Technical Digest*, pp. 677-680 (2002).
Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).
Komiak et al., "Fully Monolithic 4 Watt High Efficiency Ka-band Power Amplifier," *IEEE MTT-S International Microwave Symposium Digest*, vol. 3, pp. 947-950 (1999).
Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).
Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).
Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).
Parikh et al., "Development of Gallium Nitride Epitaxy and Associated Material-Device Correlation for RF, Microwave and MM-wave Applications," Cree, Inc. (35 slides).
Saxler et al., "III-Nitride Heterostructures on High-Purity Semi-Insulating 4H-SiC Substrates for High-Power RF Transistors," International Workshop on Nitride Semiconductors (Jul. 19, 2004).
"Thick AIN template on SiC substrate—Novel semi insulating substrate for GaN-based devices," © 2003 by TDI, Inc., http://www.tdii.com/products/AIN_SiCT.html.
Tilak et al., "Influence of Barrier Thickness on the High-Power Performance of AlGaN/GaN HEMTs," *IEEE Electron Device Letters*, 22(11), pp. 504-506 (Nov. 2001).
Walker, J. L. B. (Ed.), *High Power GaAs FET Amplifiers*, Norwood, MA: Artech House, pp. 119-120 (1993).
Wu et al., "3.5-Watt AlGaN/GaN HEMTs and Amplifiers at 35 GHz," IEDM-2003, Cree, Inc.
Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).
Shen et al., "High-Power Polarization-Engineered GaN/AlGaN/GaN HEMTs Without Surface Passivation," *IEEE Electronics Device Letters*. vol. 25, No. 1, pp. 7-9 (2004).

Adesida et al. "AlGaN/GaN . . . Applications", Proc. 6th Int. Conf. Solid-State and Int. Cir. Tech vol. 2 pp. 1163-1168 Oct. 22-25, 2001.
Extended European Search Report (6 pages) corresponding to European Application No. 06126233.3; Dated: Sep. 22, 2009.
Liu et al. "AlGaN/GaN/InGaN/GaN DH-HEMTs With an InGaN Notch for Enhanced Carrier Confinement" *IEEE Electron Device Letters* 27(1): pp. 10-12, 2006.
Japanese Office Action Corresponding to Japanese Patent Application No. 2006-335974; Mailing Date: Dec. 16, 2011; 8 pages.
Japanese Office Action Corresponding to Japanese Patent Application No. 2006-335974; Mailing Date: Apr. 10, 2012; 3 Pages (Foreign Text Only).
Japanese Office Action Corresponding to Japanese Patent Application No. 2006-552098; Mailing Date: Apr. 20, 2012; 6 Pages (Foreign Text Only).
Japanese Office Action Corresponding to Japanese Patent Application No. 2006-335974; Mailing Date: Jul. 27, 2012; Foreign Text, 4 Pages, English Translation Thereof, 7 Pages.
English Translation of Office Action for Japanese Patent Application No. 2007-506144, mailed Mar. 4, 2011; 3 pages.
Official Action corresponding to Japanese Patent Application No. 2006-552098; Mailing Date: Jun. 3, 2011; 8 pages.
Japanese Office Action Corresponding to Japanese Patent Application No. 2012-060000; Mailing Date: Oct. 25, 2013; 3 Pages (Foreign Text Only).
Wu et al., "3.5-Watt AlGaN/GaN HEMTs and Amplifiers at 35 GHz," Cree Santa Barbara Technology Center, Goleta, CA 93117.
Wu et al., "30-W/mm GaN HEMTs by Field Plate Optimization," *IEEE Electron Device Letters*, 25(3), pp. 117-119 (Mar. 2004).
Wu et al., "Bias-dependent Performance of High-Power AlGaN/GaN HEMTs," *IEDM Technical Digest*, p. 378-380 (2001).
Wu et al., "Linearity Performance of GaN HEMTs With Field Plates," DRC 2004, Cree, Inc.
Wu at al., "Linearity Performance of GaN HEMTs With Field Plates," Cree Santa Barbara Technology Center, Goleta, CA 93117.
Yu et al., "Schottky Barrier Engineering in III-V Nitrides via the Piezoelectric Effect," *Applied Physics Letters*, 73(13), pp. 1880-1882 (Sep. 28, 1998).
Zhang et al., "High Breakdown GaN HEMT with Overlapping Gate Structure," *IEEE Electron Device Letters*, 21(9), pp. 421-423 (Sep. 2000).
Beaumont, B. et al., "Epitaxial Lateral Overgrowth of GaN," *Phys. Stat. Sol.* (b) 227, No. 1, pp. 1-43 (2001).
Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).
Ben-Yaacov et al., "AlGaN/GaN Current Aperture Vertical Electron Transistors with Regrown Channels," *Journal of Applied Physics*. vol. 95, No. 4, pp. 2073-2078 (2004).
Burm et al. "Ultra-Low Resistive Ohmic Contacts on n-GaN Using Si Implantation," *Applied Physics Letters*. vol. 70, No. 4, 464-66 (1997).
Heikman, et al., "Mass Transport Regrowth of GaN for Ohmic Contacts to AlGaN/GaN," *Applied Physics Letters*. vol. 78, No. 19, pp. 2876.
Shen et al., "High-Power Polarization-Engineered GaN/AlGaN/GaN HEMTs Without Surface Passivation," *IEEE Electronics Device Letters*. vol. 25, No. 1, pp. 7-9 (2004).
Adesida et al. "AlGaN/GaN . . . Applications", Proc. 6th Int. Conf. Solid-State and Int. Cir. Tech vol. 2 pp. 1163-1168 Oct. 22-25, 2001.
Chen et al. "High-Transconductance . . . MOVPE", IEEE Elec. Dev. Lett. vol. 10 No. 4 Apr. 1989, pp. 162-164.
Wang et al. "Modfet . . . Effects", IEEE Trans. Elec. Dev. vol. 36 No. 9 Sep. 1989, pp. 1847-1850.

\* cited by examiner

|  | Sample 1 | Control 1 | Sample 2 | Sample 3 | Sample 4 | Sample 5 | Sample 6 | Control 2 | Sample 7 | Sample 8 | Sample 9 | Sample 10 | Sample 11 | Control 3 | Sample 12 |
|---|---|---|---|---|---|---|---|---|---|---|---|---|---|---|---|
| Layer 17 (AlGaN) | 27 (26%) | 27 (26%) | 27 (26%) | 27 (26%) | 27 (26%) | 27 (26%) | 27 (26%) | 27 (26%) | 27 (26%) | 27 (26%) | 25 (28%) | 25 (28%) | 25 (28%) | 25 (28%) | 25 (28%) |
| Layer 16 (AlN) | 0.7 | 0.7 | 0.7 | 0.7 | 0.7 | 0.7 | 0.7 | 0.7 | 0.7 | 0.7 | 0.8 | 0.8 | 0.8 | 0.8 | 0.8 |
| Layer 14 (GaN) | 8 | 8 | 8 | 10 | 10 | 9 | 10 | 10 | 10 | 10 | 10 | 10 | 10 | 10 | 10 |
| Layer 55 (Lt GaN) | 2 | 7 | 2 | 0 | 0 | 1 | 0 | 0 | 0 | 0 | 0 | 0 | 0 | 0 | 0 |
| Layer 38 (InGaN) | 5 (4%) 824C | 0 | 5 (8%) 784C | 5 (8%) 784C | 5 (4%) 824C | 5 (6%) 804C | 5 (8%) 779C | 0 | 5 (12%) 739C | 5 (16%) 699C | 5 (8%) 799C 5E17Si | 5 (8%) 819C 5E17Si | 5 (8%) 819C 2E18Si | 0 | 5 (8%) 799C 2E18Si |
| Layer 36 (GaN) | 2000 | 2000 | 2000 | 2000 | 2000 | 2000 | 2000 | 2000 | 2000 | 2000 | 2000 | 2000 | 2000 | 2000 | 2000 |

Layer thickness (nm)

FIG. 20

| | Rds (ohm.mm) | Ft, intr (GHz) | Vbc (ohm mm$^2$ GHz) | Dr (ohm.mm) | Indium % |
|---|---|---|---|---|---|
| Control 1 | 163.3 | 44 | 0.199 | 8.23 | 0 |
| Sample 1 | 203.2 | 40 | 0.225 | 10.23 | 4 |
| Control 2 | 137.3 | 41 | 0.156 | 6.91 | 0 |
| Sample 2 | 282.9 | 37 | 0.290 | 14.25 | 8 |
| Sample 3 | 287.8 | 44 | 0.351 | 14.50 | 8 |
| Sample 4 | 197.8 | 39 | 0.214 | 9.96 | 4 |
| Sample 5 | 244.5 | 40 | 0.271 | 12.32 | 6 |

FIG. 23a

HETEROJUNCTION TRANSISTORS HAVING BARRIER LAYER BANDGAPS GREATER THAN CHANNEL LAYER BANDGAPS AND RELATED METHODS

RELATED APPLICATION

The present application claims the benefit of priority as a divisional application of U.S. patent application Ser. No. 11/357,752 filed Feb. 17, 2006 now U.S. Pat. No. 7,612,390, which claims the benefit of priority as a continuation-in-part application of U.S. patent application Ser. No. 10/772,882 filed Feb. 5, 2004 now U.S. Pat. No. 7,170,111. The disclosures of both of the above referenced applications are hereby incorporated herein in their entirety by reference.

STATEMENT OF GOVERNMENT INTEREST

This invention was made with Government support under Contract Nos. N00014-02-C-0306 and FA8650-04-C-7146 awarded by the Office Of Naval Research (ONR) and the Air Force Research Laboratory (AFRL). The Government has certain rights in this invention.

BACKGROUND OF THE INVENTION

1. Field of the Invention

The present invention relates to high frequency transistors and in particular relates to microwave field effect transistors (FETs) that incorporate nitride-based active layers.

2. Description of the Related Art

The present invention relates to transistors formed of nitride semiconductor materials that can make them suitable for high power, high temperature, and/or high frequency applications. Materials such as silicon (Si) and gallium arsenide (GaAs) have found wide application in semiconductor devices for lower power and (in the case of Si) lower frequency applications. These more common semiconductor materials may not be well suited for higher power and/or high frequency applications, however, because of their relatively small bandgaps (e.g., 1.12 eV for Si and 1.42 for GaAs at room temperature) and/or relatively small breakdown voltages.

GaAs based HEMTs have become the standard for signal amplification in civil and military radar, handset cellular, and satellite communications. GaAs has a higher electron mobility (approximately 6000 cm$^2$/V-s) and a lower source resistance than Si, which may allow GaAs based devices to function at higher frequencies. However, GaAs has a relatively small bandgap (1.42 eV at room temperature) and relatively small breakdown voltage, which may prevent GaAs based HEMTs from providing high power at high frequencies.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials typically have higher electric field breakdown strengths and higher electron saturation velocities as compared to gallium arsenide and silicon.

A device of particular interest for high power and/or high frequency applications is the high electron mobility transistor (HEMT), which is also known as a modulation doped field effect transistor (MODFET) or a Heterostructure Field Effect Transistor (HFET). These devices may offer operational advantages under a number of circumstances. They are typically characterized by the presence of a two-dimensional electron gas (2DEG) formed at the heterojunction of two semiconductor materials with different bandgap energies, where the smaller bandgap material has a higher electron affinity compared to the larger bandgap material. The 2DEG, which forms due to the presence of an accumulation layer in the smaller bandgap material, can contain a very high sheet electron concentration in excess of, for example, $10^{13}$ carriers/cm$^2$ even though the material is nominally undoped. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a performance advantage over metal-semiconductor field effect transistors (MESFETs) for high-frequency applications, although MESFETs continue to be suitable for certain applications based on factors such as cost and reliability.

High electron mobility transistors fabricated in the gallium nitride (GaN) material system have the potential to generate large amounts of RF power because of the combination of material characteristics that includes the aforementioned high breakdown fields, their wide bandgaps, large conduction band offset, and/or high saturated electron drift velocity. In addition, polarization of GaN-based materials contributes to the accumulation of carriers in the 2DEG region.

GaN-based HEMTs have already been demonstrated. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Improvements in the manufacturing of GaN semiconductor materials have focused interest on the development of GaN HEMTs for high frequency, high temperature and high power applications. GaN-based materials have large bandgaps, and high peak and saturation electron velocity values [B. Belmont, K. Kim and M. Shur, J. Appl. Phys. 74, 1818 (1993)]. GaN HEMTs can also have 2DEG sheet densities in excess of $10^{13}$/cm$^2$ and relatively high electron mobility (up to 2000 cm$^2$/V-s) [R. Gaska, J. W. Yang, A. Osinsky, Q. Chen, M. A. Khan, A. O. Orlov, G. L. Snider and M. S. Shur, Appl. Phys. Lett., 72, 707 (1998)]. These characteristics may allow GaN HEMTs to provide high power at higher frequencies.

A conventional GaN HEMT structure 110 is illustrated in FIG. 14. A channel layer 114 is formed on buffer layer 113 on a substrate 112. A barrier layer 116 is formed on the channel layer 114. A source electrode 118 and a drain electrode 120 form ohmic contacts through the surface of the barrier layer 116 to the electron layer that is present at the top of the channel layer 114. A gate electrode 122 forms a non-ohmic contact to the surface of the barrier layer 116.

Typically, the channel layer 114 includes GaN while barrier layer 116 includes AlGaN. Because of the presence of aluminum in the crystal lattice, AlGaN has a wider bandgap than GaN. Thus, the interface between a GaN channel layer 114 and an AlGaN barrier layer 116 forms a heterostructure or heterojunction where energy bands are deformed due to, for example, Fermi level alignment and polarization in the material.

FIG. 15 is an exemplary band diagram showing the energy levels in the device along a portion of section I-I' of FIG. 14. As illustrated in FIG. 14, because the barrier layer 116 has a lower electron affinity (X) than the channel layer 114, when the Fermi levels in the materials align due to charge transfer, the energy bands of the channel layer 114 are shifted upwards, while those of the barrier layer are shifted downwards. As shown in FIG. 15, using properly designed materials, the conduction band $E_c$ dips below the Fermi level (Ef) in the area of the channel layer 114 that is immediately adjacent to barrier layer 116, forming a narrow accumulation region. Consequently, a two dimensional electron gas (2DEG) sheet charge region 115 is induced in the accumulation region at the heterojunction between the channel layer 114 and the barrier layer 116. The barrier layer 116 is made sufficiently thin so as to be depleted of mobile carriers by the junction Ruined with the gate 122 and the resulting shape of the conduction band.

In addition, in a nitride-based device, the conduction and valence bands in the barrier layer 116 are further distorted due to polarization effects. This very important property of the heterostructures in the III-Nitride system may be essential for the high performance of the GaN HEMT. In addition to the accumulation of electrons due to the bandgap differential and band offset between the barrier and channel layers, the total number of free electrons is enhanced greatly by pseudomorphic strain in the barrier layer relative to the channel. Due to localized piezoelectric effects, the strain causes an enhanced electric field and a higher electron concentration than would, typically, be possible were the strain not present.

Electrons in the 2DEG sheet charge region 115 demonstrate high carrier mobility. Moreover, because the sheet charge region is extremely thin, the carriers are subject to reduced impurity scattering that may improve the device's noise characteristics.

The source to drain conductivity of this device structure is modulated by applying a voltage to the gate electrode 122. When a reverse voltage is applied, the conduction band beneath the gate is elevated, with the result that the conduction band $E_c$ in the vicinity of the sheet charge region 115 becomes elevated above the Fermi level, and a portion of the sheet charge region 115 is depleted of carriers, thereby preventing or reducing the flow of current from source 118 to drain 120.

By forming the barrier layer 116 from AlN, certain advantages can be achieved. The 2.4% lattice mismatch between AlN ($Al_yGa_{1-y}N$ for y=1) and GaN results in an increased and even maximum possible piezoelectric charge at the interface between the two layers. Using an AlN barrier layer also reduces the piezoelectric scattering between the layers that can limit the 2DEG mobility.

However, the high lattice mismatch between AlN and GaN dictates that the thickness of the AlN layer should be less than 50 Å. If the layer is thicker, the device can experience problems with its ohmic contacts, the material quality in the layer begins to degrade, the device's reliability decreases, and the material is more difficult to grow. However, a HEMT with a 50 Å or less AlN layer may be susceptible to high gate leakage.

Although GaN-based HEMTs have demonstrated exceptional power densities, a number of technical challenges still remain to be overcome before the devices can achieve commercial success. For example, one problem that may limit the performance and lifetime of certain GaN-based HEMTs is free carrier trapping, which may occur when carriers migrate away from the 2DEG region and become trapped in a surface dielectric region or in a buffer region beneath the channel. Such trapping may result in degradation in performance and/or reliability of a device.

Some attempts have been made to improve confinement of carriers within a HEMT channel by providing a second heterojunction below the channel—a so-called Double Heterostructure HEMT or DH-HEMT. However, in general, the amount of confinement due to the heterobarrier (which is a function of the difference in electron affinity between a widebandgap layer and the narrower-bandgap channel) may not be sufficiently large to result in effective confinement. Moreover, in a highly polarized material such as c-plane GaN, the polarization charges present in the material may reduce the confinement effect of the heterobarrier. Thus, in nitride-based transistor devices, the mere presence of a heterojunction alone below the channel may not be sufficient to effectively prevent carriers from migrating away from the 2DEG region into the buffer region where they can become trapped. Moreover, the structure of a DH-HEMT provides no additional barrier against surface trapping effects.

Another problem associated with the transit of carriers away from the channel region is linearity. When carriers are not confined to the channel, the ability to control their action via the applied gate voltage may be reduced, resulting in undesirable nonlinear transconductance characteristics.

The problems associated with free carrier trapping may also affect the performance of other types of nitride field effect transistors, such as GaN-based MESFETs.

SUMMARY OF THE INVENTION

According to some embodiments of the present invention, a heterojunction transistor may include a channel layer comprising a Group III nitride, a barrier layer comprising a Group III nitride on the channel layer, and an energy barrier comprising a layer of a Group III nitride including indium on the channel layer. The barrier layer may have a bandgap greater than a bandgap of the channel layer, and the channel layer may be between the barrier layer and the energy barrier. In addition, a concentration of indium (In) in the energy barrier may be greater than a concentration of indium (In) in the channel layer.

More particularly, the channel layer and the barrier layer may cooperatively induce a two-dimensional electron gas at an interface between the channel layer and the barrier layer. For example, the energy barrier may include a layer of $In_xGa_{1-x}N$ (0<x#1), and more particularly, a layer of $In_xGa_{1-x}N$ (0<x<1). A mole fraction of InN (indium nitride) in an InN/GaN alloy of the energy barrier may be at least about 1%. For example, a mole fraction of InN (indium nitride) in an InN/GaN alloy of the energy barrier may be in the range of about 1% to about 50%, and more particularly in the range of about 4% to about 16%.

The energy barrier may oppose movement of carriers away from the channel layer, and/or the energy barrier may include a quantum well. Moreover, the energy barrier may have a thickness in the range of about 1 Angstrom to about 200 Angstroms, and more particularly, in the range of about 1 Angstrom to about 100 Angstroms.

The heterojunction transistor may also include source, drain, and gate contacts on the barrier layer such that the barrier layer is between the channel layer and the source, drain, and gate contacts, and a substrate on the energy barrier such that the energy barrier is between the substrate and the channel layer. The barrier layer may have a thickness in the range of about 0.1 nm to about 10 nm. The barrier layer and the energy barrier may be separated by a distance in the range of about 5 nm to about 30 nm, and more particularly in the range of about 5 nm to about 20 nm. In addition, the channel layer may include a layer of $Al_yGa_{1-y}N$ (0#y<1), the barrier layer may include a layer of $Al_zGa_{1-z}N$ (0<z#1), and y and z may be different.

Moreover, the heterojunction transistor may include a cap layer including a Group III nitride on the barrier layer such that the barrier layer is between the cap layer and the channel layer. A concentration of Ga in the cap layer may be greater than a concentration of Ga in the barrier layer. A concentration of Al in the barrier layer may be greater than a concentration of Al in the channel layer.

According to some additional embodiments of the present invention, a method of forming a heterojunction transistor may include forming an energy barrier comprising a layer of a Group III nitride including indium, forming a channel layer comprising a Group III nitride on the energy barrier, and forming a barrier layer comprising a Group III nitride on the channel layer so that the channel layer is between barrier layer and the energy barrier. A concentration of indium (In) in the energy barrier may be greater than a concentration of indium (In) in the channel layer, and the barrier layer may have a bandgap greater than a bandgap of the channel layer.

The channel layer and the barrier layer may cooperatively induce a two-dimensional electron gas at an interface between the channel layer and the barrier layer. For example, the energy barrier may include a layer of $In_xGa_{1-x}N$ (0<x#1), and more particularly, a layer of $In_xGa_{1-x}N$ (0<x<1). A mole fraction of InN (indium nitride) in an InN/GaN alloy of the energy barrier may be at least about 1%. More particularly, a mole fraction of InN (indium nitride) in an InN/GaN alloy of the energy barrier may be in the range of about 1% to about 50%, and more particularly, in the range of about 4% to about 16%. The energy barrier may oppose movement of carriers away from the channel layer, and/or the energy barrier may include a quantum well. Moreover, the energy barrier may have a thickness in the range of about 1 Angstrom to about 200 Angstrom, and more particularly, in the range of about 1 Angstrom to about 100 Angstroms.

Forming the energy barrier may include forming the energy barrier on a substrate. In addition, source, drain, and gate contacts may be fanned on the barrier layer after &liming the barrier layer. For example, the channel layer may include a layer of $Al_yGa_{1-y}N$ (0≤y<1), the barrier layer include a layer of $Al_zGa_{1-z}N$ (0<z≤1), and y and z may be different. After forming the barrier layer, a cap layer comprising a Group III nitride may be formed on the barrier layer, and a concentration of Ga in the cap layer may be greater than a concentration of Ga in the barrier layer. Moreover, a concentration of Al in the barrier layer may be greater than a concentration of Al in the channel layer.

Forming the channel layer may include forming a first portion of the channel layer on the energy barrier at a first temperature. After forming the first portion of the channel layer, a second portion of the channel layer may be formed at a second temperature on the first portion of the channel layer wherein the first temperature is less than the second temperature. The first temperature, for example, may be at least about 100 degrees C. less than the second temperature. In addition, the first and second portions of the channel layer may each comprise GaN.

According to some more embodiments of the present invention, a heterojunction transistor may include a channel layer, a barrier layer on the channel layer, and an energy barrier on the channel layer such that the channel layer is between the barrier layer and the energy barrier. The barrier layer and the channel layer may cooperatively induce a two-dimensional electron gas at an interface between the channel layer and the barrier layer, and the energy barrier may oppose movement of carriers away from the channel layer.

The energy barrier may include a quantum well. The channel layer may include a first layer of a Group III nitride, the barrier layer may include a second layer of a Group III nitride, and the energy barrier may include a third layer of a Group III nitride. The energy barrier, for example, may include a layer of $In_xGa_{1-x}N$ (0<x≤1), and more particularly, the energy barrier may include a layer of $In_xGa_{1-x}N$ (0<x<1). A mole fraction of InN (indium nitride) in an InN/GaN alloy of the energy barrier may be at least about 1%, and more particularly, in the range of about 1% to about 50%, and more particularly, in the range of about 4% to about 16%. Moreover, the energy barrier may have a thickness in the range of about 1 Angstrom to about 200 Angstroms, and more particularly, in the range of about 1 Angstrom to about 100 Angstroms.

The heterojunction transistor may also include source, drain, and gate contacts on the barrier layer such that the barrier layer is between the channel layer and the source, drain, and gate contacts, and the heterojunction transistor may also include a substrate on the energy barrier such that the energy barrier is between the substrate and the channel layer. The channel layer may include a Group III nitride, the barrier layer may include a Group III nitride, and the barrier layer may have a bandgap greater than a bandgap of the channel layer. The channel layer may include a layer of $Al_yGa_{1-y}N$ (0≤y<1), the barrier layer may include a layer of $Al_zGa_{1-z}N$ (0<z≤1), and y and z may be different.

In addition, a cap layer including a Group III nitride may be provided on the barrier layer such that the barrier layer is between the cap layer and the channel layer, and a concentration of Ga in the cap layer may be greater than a concentration of Ga in the barrier layer. Moreover, the barrier layer may include a Group III nitride and the channel layer may include a Group III nitride, and a concentration of Al in the barrier layer may be greater than a concentration of Al in the channel layer.

DESCRIPTION OF THE DRAWINGS

FIG. 20 is a table providing target parameters for HEMT structures (Sample1-11) including InGaN energy barrier layers according to embodiments of the present invention and for comparative HEMT structures (Control1-2) without InGaN energy barrier layers.

FIG. 23a is a table providing parameters for HEMT structures (Sample1-5 corresponding to Sample1-5 of FIG. 20) including InGaN energy barrier layers according to embodiments of the present invention, and for comparative HEMT structures (Control1-2 corresponding to Control 1-2 of FIG. 20) without InGaN energy barrier layers.

DETAILED DESCRIPTION

Figure 1:
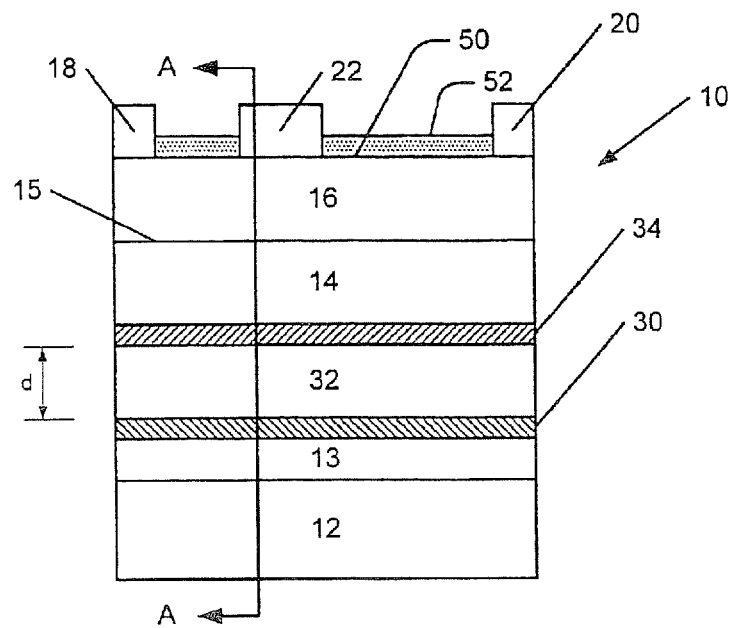
FIG. 1 is a schematic drawing showing a transistor structure according to embodiments of the present invention.

The present invention will now be described more fully with reference to the accompanying drawings in which some embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. As used herein the term "and/or" includes any and all combinations of one or more of the associated listed items.

It will be understood that although the terms first, second, etc. may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

As discussed above, confinement of carriers in the channel is an important concern in the design of a nitride-based field effect transistor. Embodiments of the present invention may provide enhanced confinement of carriers through the inclusion of a high-field region on one or both sides of a channel. The electric field in the high field region may be generated by the transfer of charge between an electron source region and a hole source region. The electric field in the high field region is directed away from the channel. Thus, the electric field opposes the movement of negatively charged electrons away from the channel. (In general, the direction of an electric field is defined by the direction of electric force acting on a positively charged particle.)

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them. For brevity, when the term AlInGaN is used herein without specification of relative percentages for the Group III elements (Al, In and Ga), it will be understood to refer to a compound of the general formula $In_xAl_yGa_zN$ where $x+y+z=1$, $0 \leq x \leq 1$, $0 \leq y \leq 1$, and $0 \leq z \leq 1$. Thus, as used herein, the term InAlGaN may refer to GaN, InN, AlN, AlGaN, AlInN, InGaN and/or AlInGaN unless otherwise specified or limited. Accordingly, the terms "InAlGaN", "Group III-nitride material" and "nitride-based material" are used interchangeably throughout this specification.

Embodiments of the present invention are schematically illustrated as a high electron mobility transistor (HEMT) 10 in the cross-sectional view of FIG. 1. The transistor 10 includes a substrate 12 that may be, for example, semi-insulating silicon carbide (SiC) of the 4H polytype. Other silicon carbide candidate polytypes including the 2H, 3C, 6H, and 15R polytypes may be utilized. The term "semi-insulating" is used descriptively in a relative sense rather than in an absolute sense. In particular embodiments of the present invention, the silicon carbide bulk crystal may have a resistivity equal to or higher than about $1 \times 10^5$ Ω-cm at room temperature.

A buffer layer 13 on the substrate 12 provides an appropriate crystalline transition between the substrate 12 and the remainder of the device. Buffer layer 13 may include one or more layers of InAlGaN. In particular embodiments, buffer layer 13 may include AlN or AlGaN. Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Suitable SiC substrates are manufactured by, for example, Cree, Inc., of Durham, N.C., the assignee of the present invention, and the methods for producing are described, for example, U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Particular structures for GaN-based HEMTs are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," U.S. patent application Ser. No. 10/102,272, to Smorchkova et al., entitled "GROUP-III NITRIDE BASED HIGH ELECTRON MOBILITY TRANSISTOR (HEMT) WITH BARRIER/ SPACER LAYER" and U.S. patent application Ser. No. 10/199,786, to Saxler, entitled "STRAIN BALANCED NITRIDE HETEROJUNCTION TRANSISTORS AND METHODS OF FABRICATING STRAIN BALANCED NITRIDE HETEROJUNCTION TRANSISTORS" the disclosures of which are hereby incorporated herein by reference in their entirety. Embodiments of the present invention may be incorporated into such structures and, therefore, should not be construed as limited to the particular structures described in detail herein.

Returning again to FIG. 1, a transistor 10 includes a channel layer 14. In some embodiments of the present invention, the channel layer 14 includes InAlGaN. In particular embodiments, the channel layer 14 includes $Al_xGa_{1-x}N$ (0≤x≤1). In some embodiments of the present invention, the channel layer 14 includes GaN. The channel layer 14 may be undoped and may be grown to a thickness of between about 50 and about 500 Å. Thus, the channel layer 14 may be thinner than channel layers in conventional GaN HEMT devices, which are typically greater than 500 Å in thickness. In some of the embodiments described above, it may be desirable for the semiconductor crystal structure to be oriented in a Ga-polar (or Group III polar) orientation to enhance the effect of the piezoelectric quality of the material. However, many of the embodiments, including the embodiment of FIG. 1, may be formed using N-polar or non-polar material without departing from the scope of the invention.

A barrier layer 16 is provided on the channel layer 14. The barrier layer 16 may be a Group III-nitride having a bandgap larger than that of the channel layer 14. Accordingly, the barrier layer 16 may be AlGaN, AlInGaN, AlInN and/or AlN. The barrier layer 16 may be at least about 10 nm thick, but is not so thick as to cause cracking or defect formation therein. Moreover, the barrier layer 16 should be thin enough that it is completely depleted under equilibrium conditions.

Preferably, the barrier layer 16 is undoped or doped with activated donor atoms at a concentration of less than about $10^{19}$ cm$^{-3}$. In some embodiments, the barrier layer 16 may be delta-doped at a concentration of up to about $10^{13}$ cm$^{-2}$ at a distance of about 100 Å (Angstroms) from the interface between barrier layer 16 and channel layer 14. In some embodiments of the invention, the barrier layer 16 includes $Al_xGa_{1-x}N$ where 0<x≤1. In certain embodiments of the present invention, the barrier layer 16 includes AlGaN with an aluminum concentration of between about 5% and about 100%. In specific embodiments of the present invention, the aluminum concentration is greater than about 10%. The barrier layer 16 has a bandgap greater than that of the channel layer 14.

The barrier layer may also be provided with multiple layers as described in U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" and U.S. Pat. No. 6,316,793 entitled "Nitride Based Transistors on Semi-Insulating Silicon Carbide Substrates with Passivation Layer" issued Nov. 13, 2001, the disclosures of which are incorporated herein by reference as if set forth fully herein. Thus, embodiments of the present invention should not be construed as limiting the barrier layer to a single layer but may include, for example, barrier layers having combinations of InAlGaN layers having various material compositions. For example, a GaN/AlN structure may be utilized to reduce or prevent alloy scattering.

An optional InAlGaN contact layer or cap layer (not shown) may be provided on the barrier layer 16 to facilitate the formation of contacts of the transistor 10. An example of such a cap layer is disclosed in U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," which is referenced above. In addition, there may be a compositionally graded transition layer (not shown) between the barrier layer 16 and the contact or cap layer. The source contact 18, the drain contact 20 and the gate contact 22 may be fabricated as described in U.S. Pat. No. 6,316,793.

As discussed above, a 2DEG sheet charge region 15 is induced at the interface between channel layer 14 and barrier layer 16. In order to reduce the movement of carriers away from the channel layer 14, a region 32 having a high electric field is provided between the channel layer 14 and the buffer layer 13. In some embodiments, the high field is generated by charge transfer between an electron source layer 34 and a hole source layer 30 which are spaced apart by a distance "d" which defines the thickness of the high field region 32.

In some embodiments, including the embodiment illustrated in FIG. 1, the electron source layer 34 may include a thin layer of a Group III-nitride material such as $Al_xGa_{1-x}N$ ($0 \leq x \leq 1$) that is highly doped with donor (n-type) dopants, while the hole source layer 30 may include a thin layer of a Group III-nitride material such as $Al_xGa_{1-x}N$ ($0 \leq x \leq 1$) that is highly doped with acceptor (p-type) dopants. The electron source layer 34 and the hole source layer 30 are spaced apart by a distance "d" that defines a high field region 32 therebetween. When the electron source layer 34 and the hole source layer 30 are formed, charge transfer between the layers occurs to cause the Fermi levels of the layers to align (i.e. to ensure that under equilibrium conditions, the average electron energy is the same throughout the structure). This charge transfer causes a depletion region to form between the electron source region and the hole source region. The charge transfer may fully deplete the electron source region and/or the hole source region. The depletion region is characterized by a high electric field directed away from the channel layer 14. The magnitude of the induced electric field is proportional to the doping levels in the electron source layer and the hole source layer. A built-in potential is developed between the electron source layer and the hole source layer that is proportional to the thickness of the high field region (i.e. the distance between the electron source region and the hole source region. Accordingly, by selecting appropriate values for the thickness, doping level and spacing of the electron source layer 34 and the hole source layer 30, a potential barrier up to the bandgap (less the donor and acceptor ionization energies) may be formed. However, it may be preferable to provide a potential barrier somewhat less than the theoretical maximum, for example less than about 3 eV for GaN (which has a nominal bandgap of about 3.5 eV).

Moreover, the buffer 13 may be doped with deep acceptors as described in S. Heikman et al., Growth of Fe-Doped Semi-insulating GaN by Metalorganic Chemical Vapor Deposition, Appl. Phys. Let. 81, pp. 439-441 (2002). Specific examples of co-doped layers are provided in U.S. patent application Ser. No. 10/752,970 entitled "Co-Doping for Fermi Level Control in Semi-Insulating Group III Nitrides", filed Jan. 7, 2004 and assigned to the assignee of the present invention, the disclosure of which is incorporated herein by reference. The buffer could be doped with Fe or another deep acceptor.

Figure 2:
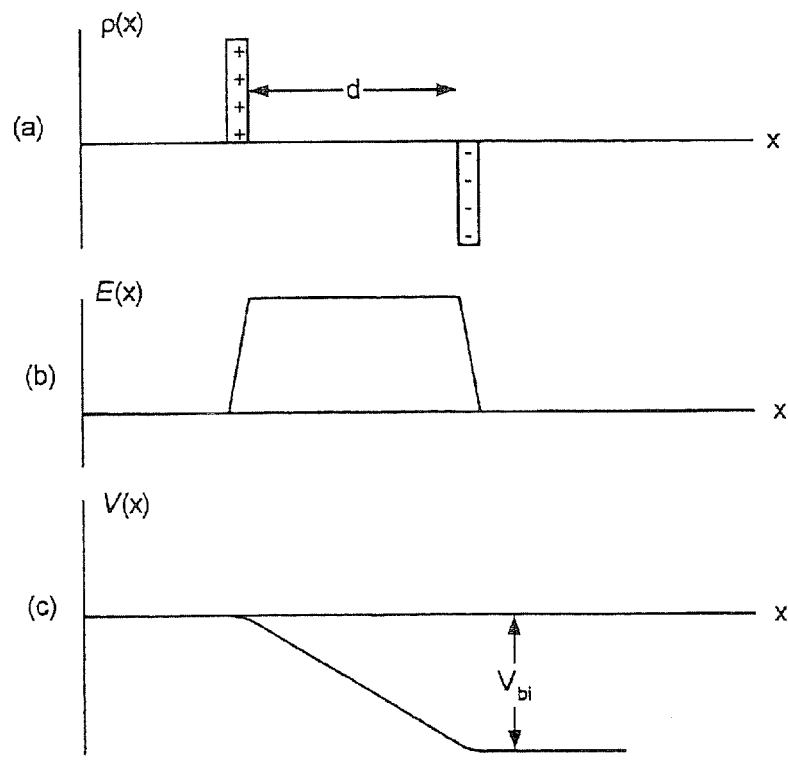
FIG. 2 is an illustrative graph showing (a) the charge density, (b) electric field and (c) electric potential within a region of the structure of FIG. 1.

This effect is illustrated in FIG. 2, which shows illustrative graphs of charge (FIG. 2(a)), electric field (FIG. 2(b)) and voltage (FIG. 2(c)) in the vicinity of a pair of thin, oppositely doped layers having high dopant concentrations. Graphs of band energies, voltages, electric fields and charge such as the graphs in FIG. 2 are not intended to be to scale, nor are they graphs of actual measurements. Rather, they are exemplary graphs that are included merely to illustrate various characteristics of the structures in question.

Because the electron source layer is designed to be fully depleted, the layer is characterized by a fixed positive charge from the ionized donor atoms. In the illustration of FIG. 2, the electron source layer and hole source layer are modeled as thin, highly doped layers spaced a distance "d" apart. The electric field within the structure is obtained by integrating the charge density along the direction of interest. Mathematically, the electric field E is given by the following equation:

$$E(x) = \frac{1}{K_s \varepsilon_0} \int_{-\infty}^{x} \rho(x) dx$$

where $K_S$ is the relative dielectric constant of the semiconductor material and $\varepsilon_0$ is the permittivity of free space. Since the structure is in equilibrium, the net charge density is assumed to be zero within the immediate vicinity of the electron source layer and hole source layer but nonzero within those layers. The resulting electric field is shown in FIG. 4(b). Namely, the field is approximately constant between the electron source layer and the hole source layer, and zero elsewhere. The electric potential V in the structure is given by the equation:

$$V(x) = \int_{-\infty}^{x} E(x) dx$$

The electric potential in the structure is illustrated in FIG. 2(c). As illustrated therein, the maximum value of the electric potential, called the built-in voltage and designated $V_{bi}$, is reached at the edge of the hole source layer 30. Accordingly, the distance "d" between the electron source layer and the hole source layer and the magnitude of the electric field E collectively determine the magnitude of the potential barrier provided by the high field region 32.

As an example of a design methodology, consider a pair of two oppositely doped layers which are very thin compared to their separation. Assume both are have an identical sheet charge that is depleted. Thus, the sheet charge density in each layer is given as $N_{sheet} = P_{sheet}$ (both given in units of $cm^{-2}$).

The electric field between the two sheets of charge is then $(q \times P_{sheet})/\varepsilon$ where q is the elementary charge ($1.602 \times 10^{-19}$ C) and $\varepsilon$ is the dielectric constant of the material (about $9 \times 8.85 \times 10^{-14}$ F/cm for GaN). For GaN, the electric field would be about $P_{sheet} \times (2 \times 10^{-7}$ V-cm). Thus, for a sheet charge density of $10^{12}$ cm$^{-2}$, the field would be about $2 \times 10^5$ V/cm.

The built in voltage is the product of the electric field with the separation distance d.

$$V_{bi} = d^*(q^*P_{sheet})/\varepsilon$$

This voltage is necessarily less than $E_g - E_a - E_d$ where $E_g$ is the energy gap, $E_a$ is the acceptor ionization energy relative to the valence band and $E_d$ is the donor ionization energy relative to the conduction band. To ensure full depletion, a voltage for the barrier should be chosen to be safely below $E_g - E_a - E_d$.

So, if $V_{bi} < (E_g - E_a - E_d)/q$

Then $d \times (q \times P_{sheet})/\varepsilon < (E_g - E_a - E_d)/q$ $d \times P_{sheet} \times (2 \times 10^{-7}$ V-cm$) < (E_g - E_a - E_d)/q$ $d \times P_{sheet} < 5 \times 10^6 \times (E_g - E_a - E_d)/q (V^{-1}$ cm$^{-1})$ If we assume relatively shallow acceptors and donors, a 2V barrier may be an appropriate goal.

$d \times P_{sheet} < 2 \times 5 \times 10^6 /cm = 10^7 /cm$ $d \times P_{sheet} < 10^7 /cm \times 10^4 \mu m/cm$ $d \times P_{sheet} < 10^{11} \mu m/cm^2$ If we choose a sheet charge density that is small compared to the channel charge, but large enough for a field that may improve confinement, for example $10^{12}$ cm$^{-2}$ then $d < 10^{11} \, \mu m/cm^2/P_{sheet}$ or $d < 0.1 \, \mu m$ In order to obtain a sheet density of $10^{12}$ cm$^{-2}$ in the electron source layer 34 and the hole source layer 30, the semiconductor crystal may be delta doped. As is known in the art, delta doping refers to doping a semiconductor layer with a very high density of dopants in a very thin region. For example, to form hole source layer 30, the semiconductor crystal of $Al_xGa_{1-x}N$ may be doped with an acceptor such as Mg or Zn at an activated concentration of about $10^{18}$ cm$^{-3}$ for a depth of about 10 nm. Hole source layer 30 may be doped with deep level acceptor elements such as Fe or V. Alternatively, hole source layer 30 may be co-doped with deep level transition elements, such as Fe or V, along with shallow acceptor dopants, such as Zn and/or Mg. Using shallow acceptors with smaller activation energies $E_a$ may yield a larger maximum built-in voltage $V_{bi}$. However, if the material is overdoped, free acceptors could be generated which would adversely impact device performance. Also, it is undesirable to form a "camel hump" in the conduction band $E_c$ that could trap electrons. Thus, it may be preferable to keep $V_{bi}$ fairly low and choose a dopant with a low memory effect in the growth system.

Similarly, the electron source layer may be doped with Si, Ge or O atoms. However, other forms of doping may be used in conjunction with thicker layers. For example, doping in the layers could be progressively graded or abrupt. Moreover, the electron source layer and the hole source layer may be thicker or thinner than 10 nm. In general, the electron source layer and hole source layer may each range in thickness from about 0.2 nm to about 100 nm. The electron source layer and the hole source layer do not have to have the same thickness or doping density.

Thus, for a 2V barrier, "d" may be less than about 0.1 μm. In general, depending on the desired barrier height and the doping levels used, the thickness "d" of the high field region 32 may range from about 10 nm to about 200 nm.

Depending on the desired barrier, different doping levels and spacings may be chosen. In some embodiments, the barrier may have a potential height of less than about 0.5V. In other embodiments, the barrier height may be about 1V or less. In still other embodiments, the barrier height may be about 2V or less. As discussed above, the limit on the barrier height is that it be less than $(E_g - E_a - E_d)$.

Figure 1A:
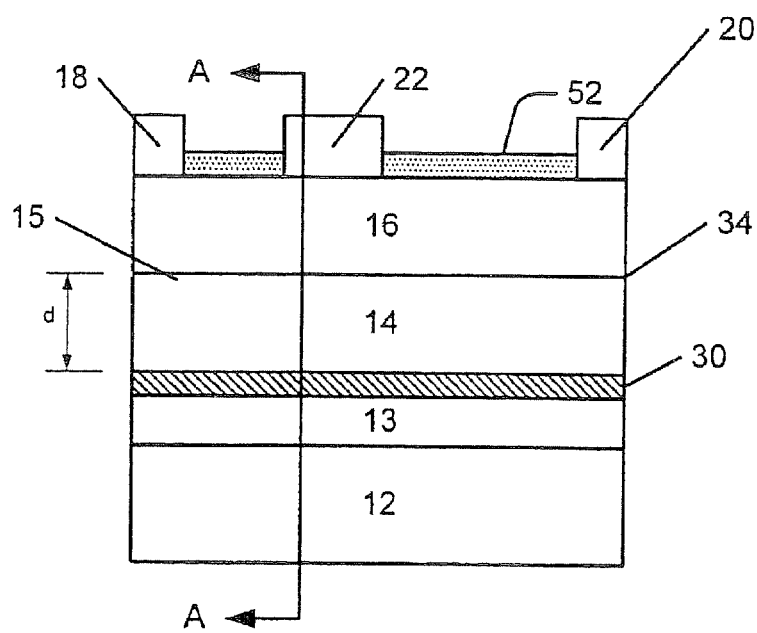
FIG. 1A is a schematic drawing showing a transistor structure according to further embodiments of the present invention.

In some embodiments, the electron source layer may include the 2DEG region induced at the interface of the barrier layer and the channel layer. In such embodiments, the 2DEG region should not be fully depleted by the hole source region. An example of such embodiments is shown in FIG. 1A in which a hole source region 30 is formed beneath the channel layer 14. The 2DEG region 15 at the interface between channel layer 14 and barrier layer 16 acts as the electron source layer 34. Thus, the entire channel layer 14 may function as a high-field region 32 that opposes the movement of carriers away from the 2DEG region 15.

Figure 3:
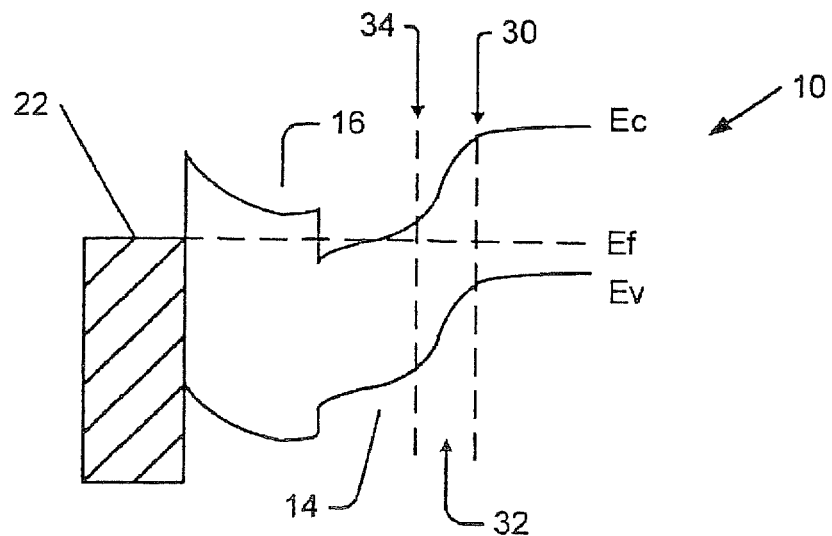
FIG. 3 is an illustrative graph of the band diagram of a region within the embodiments illustrated in FIG. 1.

FIG. 3 is a graph of energy level versus position (x) in portions of the transistor 10. Because of the presence of aluminum in the crystal lattice, AlGaN has a wider bandgap than GaN. Thus, the interface between the channel layer 14 and the barrier layer 16 forms a heterostructure in which the conduction and valence bands $E_c$ and $E_v$ are offset. Charge is induced due to the piezoelectric effect and spontaneous doping. The conduction band $E_c$ dips below the Fermi level $E_f$ in the area of the channel layer 14 that is immediately adjacent to the barrier layer 16. Consequently, a two dimensional electron gas (2DEG) sheet charge region is induced at the heterojunction between the channel layer 14 and the barrier layer 16, while layer 16 is depleted of mobile carriers due to the shape of the conduction band.

The conductivity of this region is modulated by applying a voltage to the gate electrode 22. When a reverse voltage is applied, the conduction band in the vicinity of conduction layer 15 is elevated above the Fermi level, and a portion of the conduction layer 15 is depleted of carriers, thereby preventing the flow of current from the source 18 to the drain 20.

To oppose the movement of electrons away from the channel layer, an energy barrier is formed by inserting the electron source layer 34 and the hole source layer 30 between the channel layer 14 and the buffer layer 13. The electron source layer 34 and the hole source layer 30 are spaced apart by a distance "d" which defines a region 32 having a high electric field. The slope of the energy bands within the region 32 is directly related to the strength of the electric field in this region. As illustrated in FIG. 3, the large slope of the conduction band Ec within the high field region 32 presents a large potential barrier that opposes the movement of electrons from the channel layer 14 toward the buffer layer 13. More specifically, the potential barrier created by the high field region 32 tends to cause electrons in the 2DEG region not to migrate into the buffer region where they could become trapped or become less susceptible to influence by a gate voltage.

Figure 4:
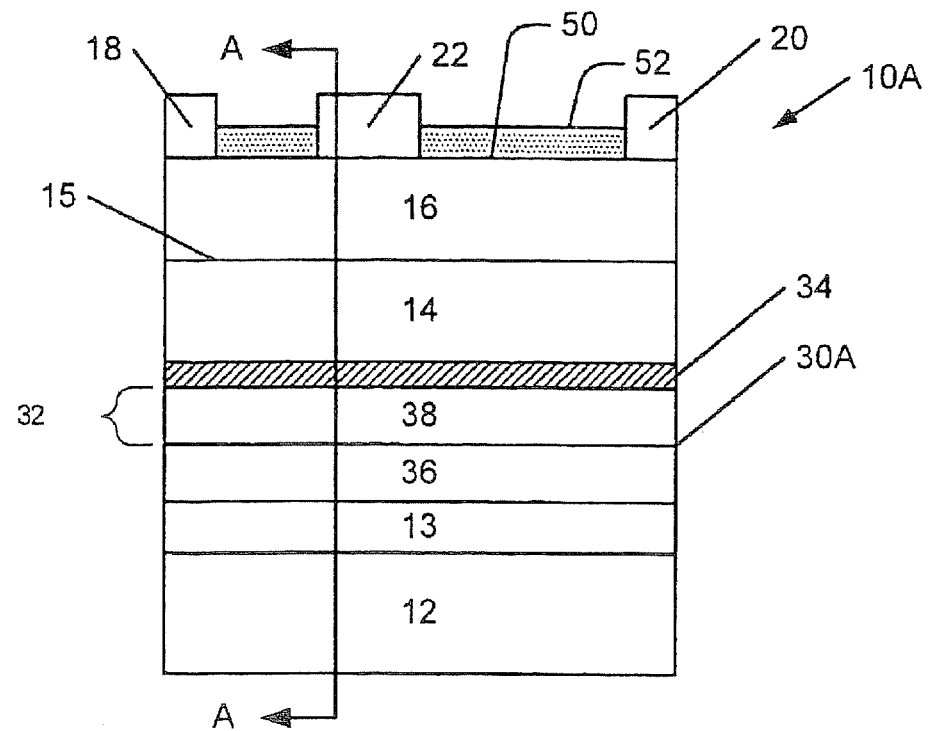
FIG. 4 is a schematic drawing showing a transistor structure according to further embodiments of the present invention.

Other embodiments of the present invention are illustrated in FIG. 4. As described in connection with structure 10 of FIG. 1, structure 10A of FIG. 4 includes a substrate 12, a buffer layer 13, a channel layer 14 and a barrier layer 16 which are formed as described above in connection with FIG. 1. Structure 10A further includes an electron source region 34 and a high electric field region 32. As with the embodiments illustrated in FIG. 1, electron source region 34 that may include a thin, highly doped semiconductor layer. In structure 10A, however, the hole source layer 30 is provided by a heterointerface between a first layer 38 that provides the high field region 32 and a second layer 36. It will be understood that the heterointerface between the first layer 38 and the second layer 36 may include an abrupt or graded junction. The second layer 36, which may include $Al_xGa_{1-x}N$ ($0 \leq x \leq 1$), has a higher bandgap than the first layer 38. The second layer 36 may be undoped, lightly doped with shallow p-type dopants and/or doped with deep-level p-type dopants. Accordingly, when the first and second layers 38 and 36 are formed, the region near the heterointerface between the first and second layers 38 and 36 is induced to become highly p-type due to piezoelectric band bending. Thus, even though the structure does not include a highly p-doped layer, a quasi-p-type region is induced at the interface between the first and second layers 38 and 36 that serves as a hole source region.

As with the embodiments described above, the transfer of carriers between the quasi-p-type region created at the interface between the first and second layers 38 and 36 and the electron source layer 34 creates a high field region 32 that serves as a barrier against electrons transiting away from the 2DEG region 15.

In some embodiments, the second layer 36 comprises InAlGaN. In particular embodiments, the second layer 36 may include $Al_xGa_{1-x}N$ with $0.02 \leq x \leq 0.2$. The second layer 36 may also have a graded composition for lattice matching or strain relief. The second layer 36 may be from 10 nm to 10 μm thick. Moreover, the second layer 36 may be omitted altogether if buffer layer 13 has a suitable aluminum composition such that an interface between buffer layer 13 and the first layer 38 forms a heterojunction capable of acting as a hole source layer.

Figure 5:
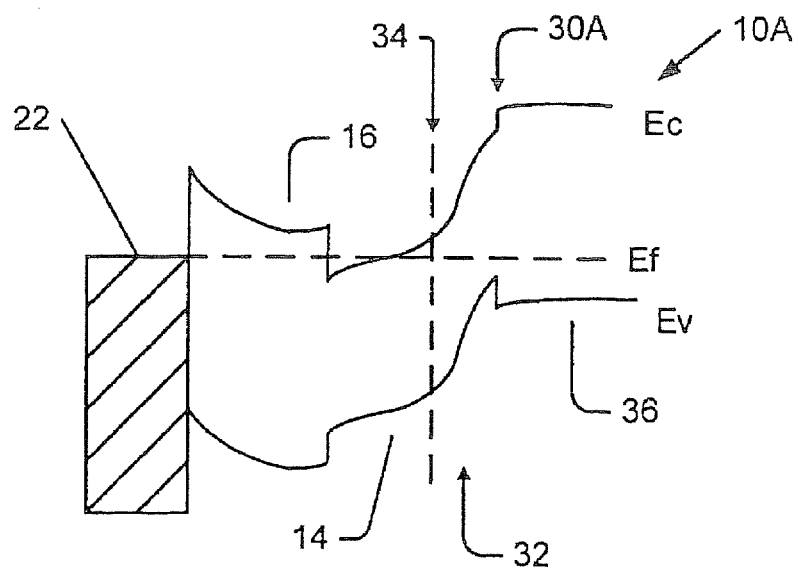
FIG. 5 is an illustrative graph of the band diagram of a region within the embodiments illustrated in FIG. 4.

An illustrative band diagram for the structure of FIG. 4 is shown in FIG. 5. As illustrated in FIG. 5, a high field region 32, characterized by a steep positive slope of the conduction band, is formed between an electron source layer 34 and a hole source layer 30A formed at an interface between high field region 32 and the second layer 36. The electric field within the high field region 32 opposes the movement of carriers away from channel layer 14.

As discussed above, it may also be desirable to prevent as many carriers from the channel layer 14 from reaching the surface of a transistor device. Although the exposed surface of a transistor device is usually passivated, carrier trapping in interface states of a passivation layer may have a negative impact on the performance and/or lifetime of a microwave transistor.

Figure 6:
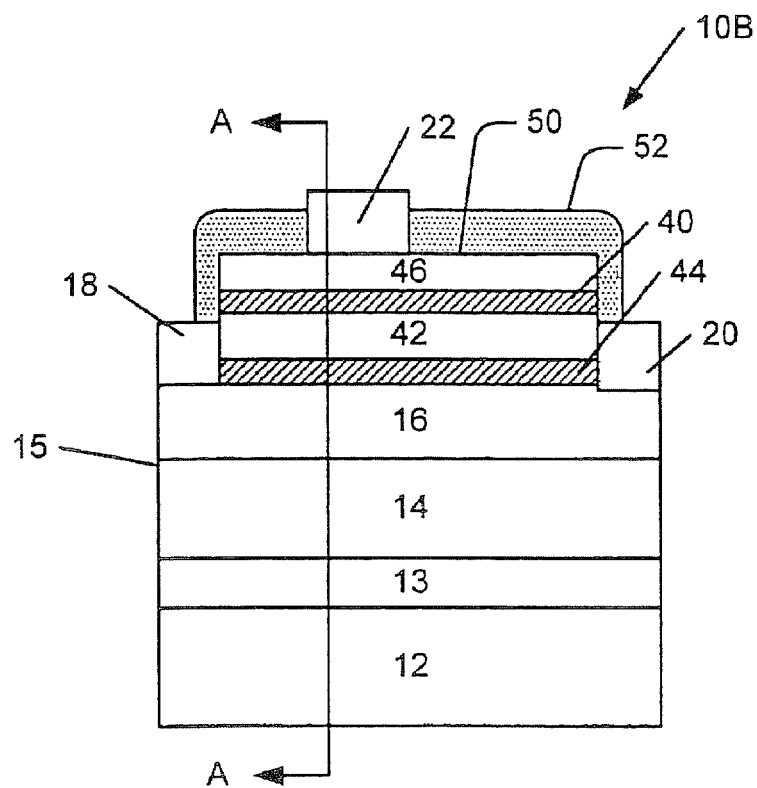
FIG. 6 is a schematic drawing showing a transistor structure according to further embodiments of the present invention.

Accordingly, in some embodiments of the invention, a potential barrier is formed in the structure to resist or oppose the movement of carriers away from the channel layer 14 towards the surface of the device. FIG. 6 illustrates embodiments of the invention in which a potential barrier is formed between the barrier layer 16 and the upper surface 50 of a device 10B by means of a hole source layer 40 and an electron source layer 44 positioned sufficiently close to each other form a high field region 42 there between. As described above in connection with the devices illustrated in FIG. 1 and FIG. 4, device 10B includes a substrate 12, a buffer layer 13, a channel layer 14 and a barrier layer 16. The electron source layer 44 may be formed on the barrier layer 16. The thickness and doping of the electron source layer 44 may be the same as described in connection with reference to the electron source layer 34 of FIG. 1. The hole source layer 40 is formed in close proximity to the electron source layer 44 but spaced apart by a distance "d" that defines high field layer 42. An optional cap layer 46 may be formed on the hole source layer 40. A passivation layer 52 covers the exposed upper surfaces of the device 10B. The passivation layer 52 may include SiN and/or $SiO_2$. The formation of passivation layers on GaN-based layers is well known in the art.

Figure 8:
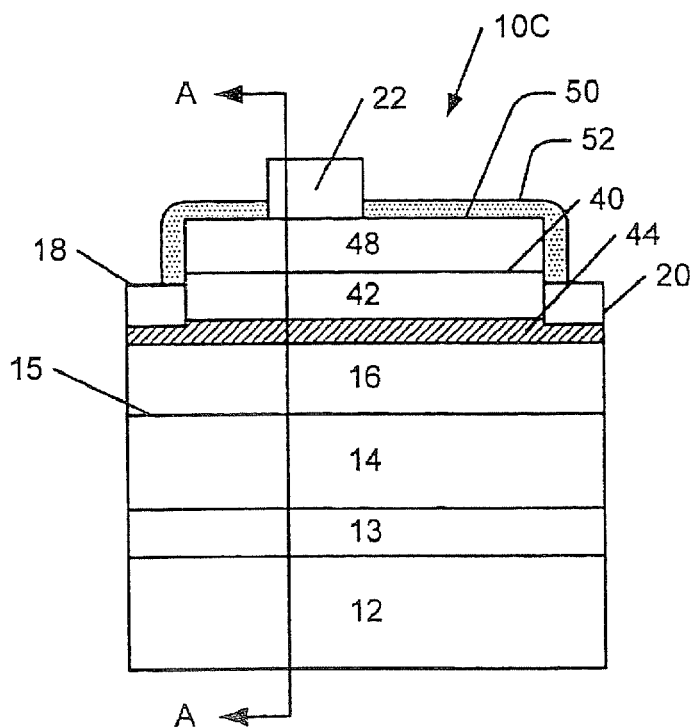
FIG. 8 is a schematic drawing showing a transistor structure according to further embodiments of the present invention.
Figure 10:
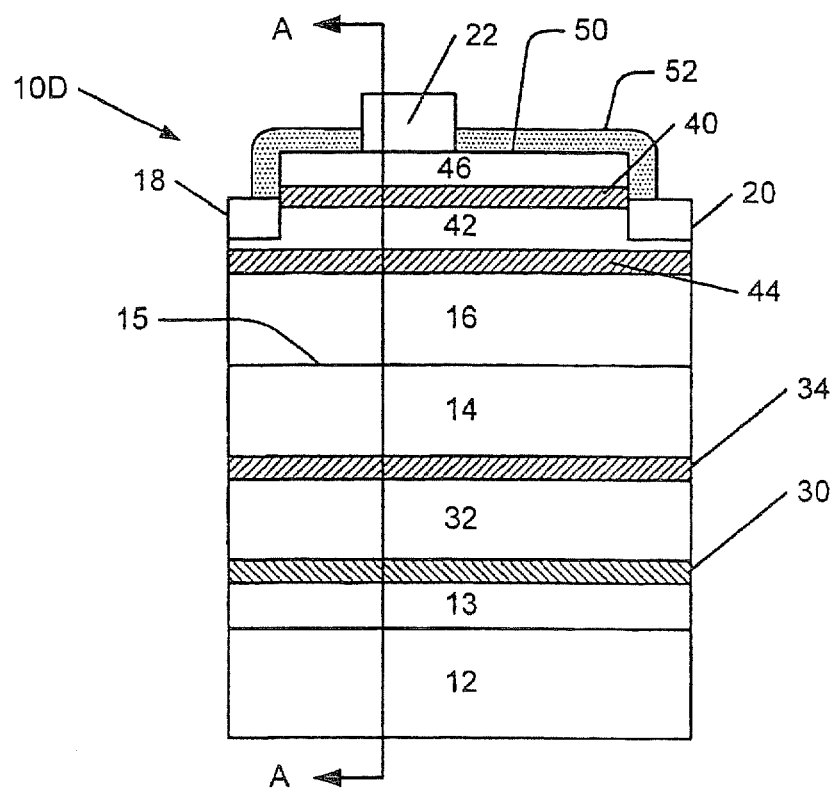
FIG. 10 is a schematic drawing showing a transistor structure according to further embodiments of the present invention.

In order to form effective source and drain ohmic contacts 18, 20 it may be desirable to recess the contacts, for example by etching through the hole source layer 40, the high field layer 42 and the electron source layer 44 to expose a surface of barrier layer 16 prior to metallization as illustrated in FIG. 6. Alternatively, in certain embodiments of the present invention, the etch extends only into high field layer 42 or electron source layer 44 prior to metallization as shown in FIGS. 10 and 8 respectively. The exposed surface may also be implanted with ions to provide a better surface for forming an ohmic contact.

Figure 7:
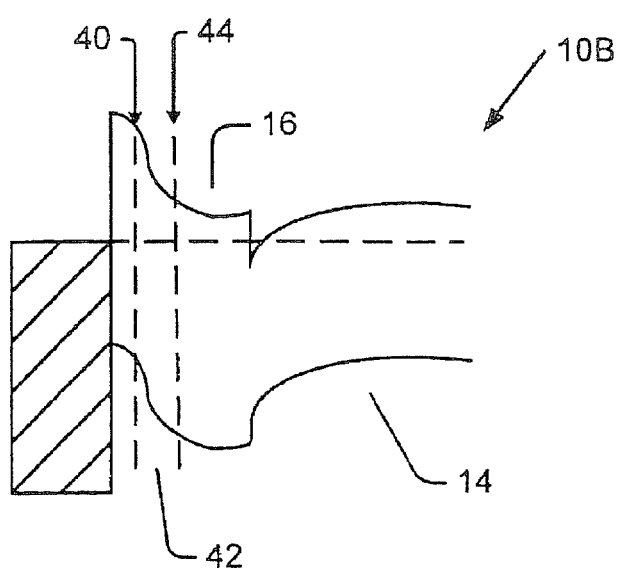
FIG. 7 is an illustrative graph of the band diagram of a region within the embodiments illustrated in FIG. 6.

An illustrative band diagram for the structure of FIG. 6 is shown in FIG. 7. As illustrated in FIG. 7, a high field region 42, characterized by a steep negative slope of the conduction band, is formed between an electron source layer 44 and a hole source layer 40 in a device 10B. The electric field within the high field region opposes the movement of carriers away from the channel layer 14 towards the surface 50 of the device 10B.

As with the embodiments illustrated in FIG. 4, the hole source layer 40 may be provided by a heterojunction interface between the high-field layer and a higher-bandgap layer. Such an embodiment is illustrated in FIG. 8 in which an electron source layer 44 is formed on the barrier layer 16. A high field layer 42 is formed on the electron source layer 44 and a layer 48 having a narrower bandgap than the high field layer 42 forms an abrupt or graded heterojunction with the high field layer 42. The lower band-gap layer 48, which may include $Al_xGa_{1-x}N$ (0≤x≤1), may be undoped or lightly doped with p-type dopants. Accordingly, when the layers are formed, the region near the heterointerface between layers 48 and 42 is induced to act as a hole source due to spontaneous and piezoelectric polarization charge. Thus, even though the structure does not include a highly p-doped layer, a quasi-p-type region 40 is induced at the interface between layers 42 and 48 which serves as a hole source region.

Figure 9:
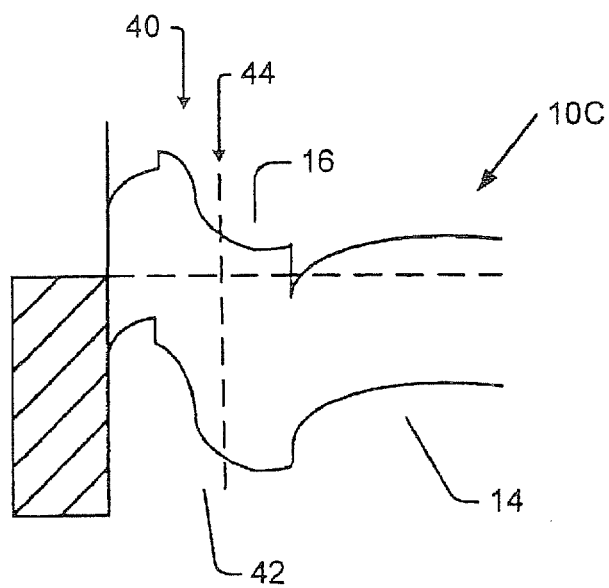
FIG. 9 is an illustrative graph of the band diagram of a region within the embodiments illustrated in FIG. 8.

An illustrative band diagram of the device 10C is shown in FIG. 9. As illustrated in FIG. 9, a high field region 42 is formed due to charge transfer between electron source layer 44 and hole source region 40 that is induced at the interface between layers 42 and 48.

Figure 11:
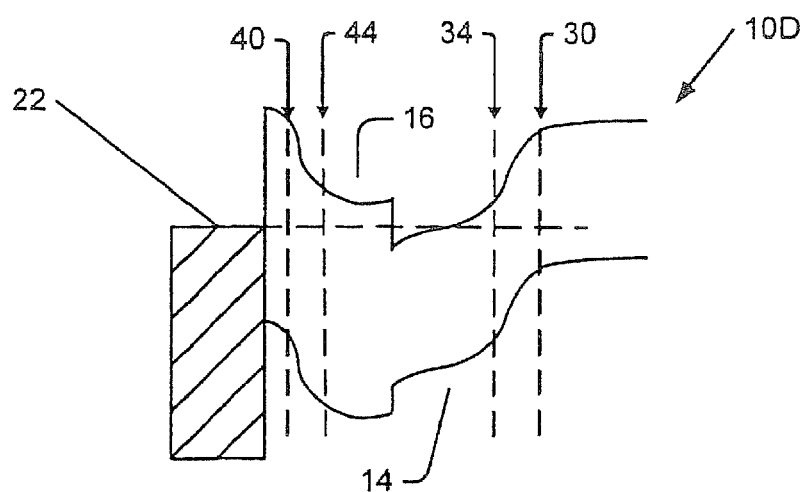
FIG. 11 is an illustrative graph of the band diagram of a region within the embodiments illustrated in FIG. 10.

The carrier confining potential barriers described with reference to FIGS. 1 through 9 above may be provided in the same device to provide confinement of carriers both above and below the channel region of the device. An exemplary structure is shown in FIG. 10. Device structure 10D includes a potential barrier below the channel layer 14 (i.e. between channel layer 14 and buffer layer 13) formed by the electron source layer 34 and the hole source layer 30 as well as a potential barrier above the channel layer 14 (i.e. between the barrier layer 16 and the upper surface 50 of the device 10D) formed by the electron source layer 44 and the hole source layer 40. An illustrative band diagram for the structure of device 10D is shown in FIG. 11. As is evident from FIG. 11, large potential barriers are formed on both sides of the channel layer to oppose the movement of carriers away from the channel region in either direction. As with the embodiments described above, the hole source layers 30, 40 could be formed as thin layers doped with high concentrations of acceptors or they could be induced at heterojunction interfaces as described in connection with the embodiments of FIGS. 8 and 4.

Figure 12:
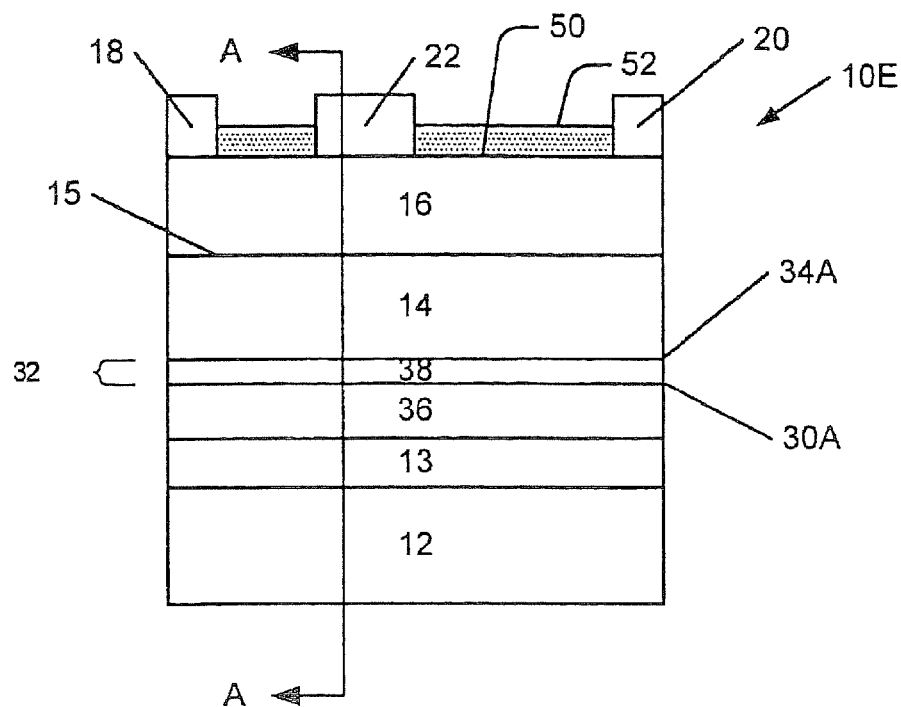
FIG. 12 is a schematic drawing showing a transistor structure according to further embodiments of the present invention.

Other embodiments of the present invention are illustrated in FIG. 12. As described in connection with structure 10 of FIG. 1, structure 10E of FIG. 12 includes a substrate 12, a buffer layer 13, a channel layer 14 and a barrier layer 16 which are formed as described above in connection with FIG. 1. Structure 10E further includes interface regions 30A and 34A between which a quantum well is formed. In structure 10E, the first layer 38 has a narrower band gap and larger lattice constant than the channel layer 14 and the second layer 36 so as to provide a quantum well that provides the barrier. In particular embodiments of the present invention, the first layer 38 is InN and the channel layer 14 and second layer 36 are GaN. For an InN first layer 38, the layer may be approximately 1 monolayer thick (~3 Å). The charge anticipated with an InN/GaN interface is expected to be very high (>2E14 $cm^{-2}$), so no more than ~2 monolayers would be desired for a large barrier. The interfaces 30A and 34A are the hole and electron source regions, respectively, each possessing this very large charge density. Therefore, a very thin layer 38 is capable of producing a large barrier as previously described. Also, the InN layer should be kept thin enough so that there are no allowed energy levels formed within the quantum well that may act as electron or hole traps. Accordingly, for a GaN/InN/GaN structure, the InN should be kept below ~2 monolayers for this reason. For a GaN/InGaN/GaN (or AlGaN/GaN/AlGaN or other InAlGaN/InAlGaN/InAlGaN) structure for a given barrier, the thickness would need to be increased approximately linearly as the band offset is decreased, but the maximum allowable thickness for forbidding quantum levels within the well scales only approximately as the square root—therefore a large discontinuity in band gap may be desirable. Interface regions 30A and 34A may each be either abrupt or graded.

In certain of the embodiments illustrated in FIG. 12, the channel layer 14 may be a thin layer (~30-300 Å)—just thick enough to contain the 2DEG and allow enough thickness to switch to high quality GaN during the growth. In embodiments where the layer 38 is InN, to keep the InN from decomposing during heating up to the subsequent GaN growth temperatures, MBE or high pressure MOCVD may be utilized rather than conventional reduced pressure MOCVD.

Figure 13:
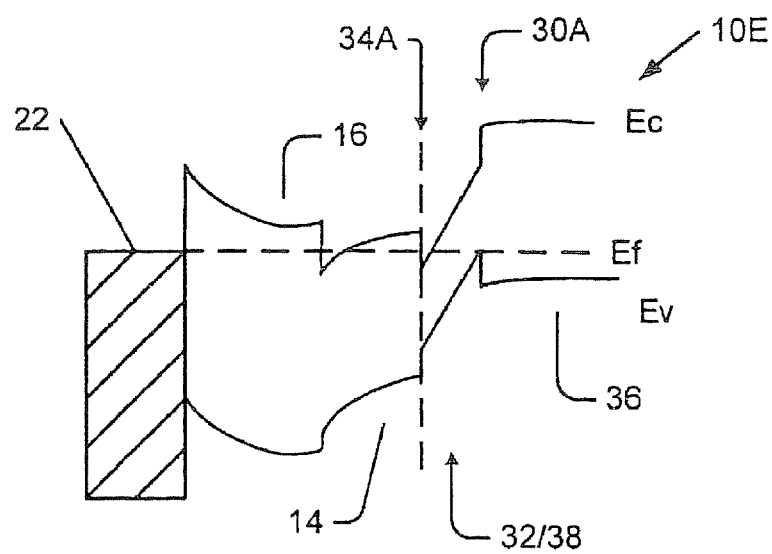
FIG. 13 is an illustrative graph of the band diagram of a region within the embodiments illustrated in FIG. 12.
Figure 14:
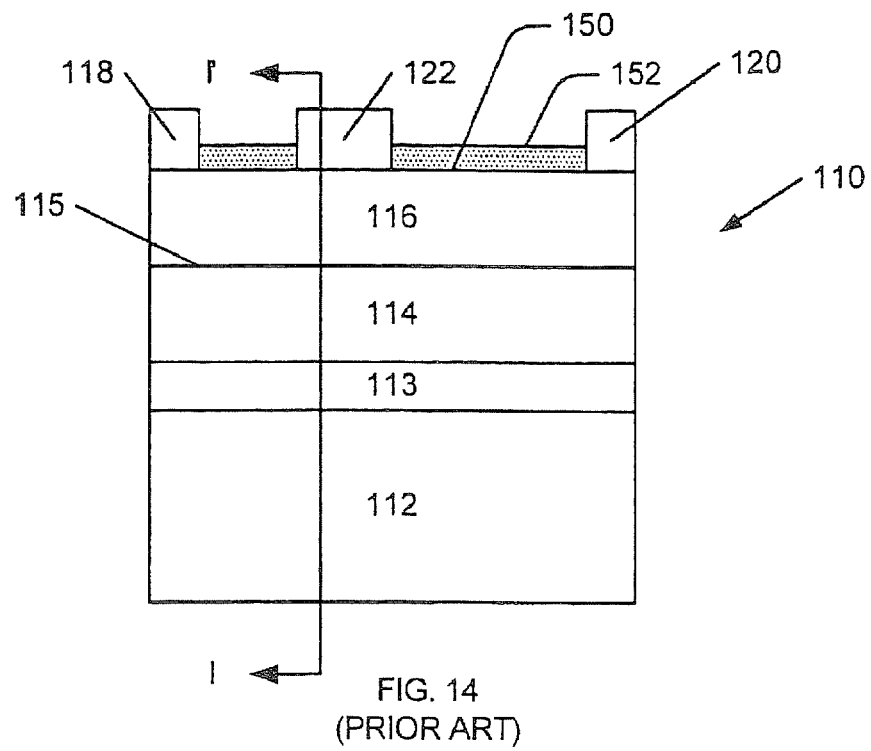
FIG. 14 is a schematic diagram of a prior art HEMT structure.
Figure 15:
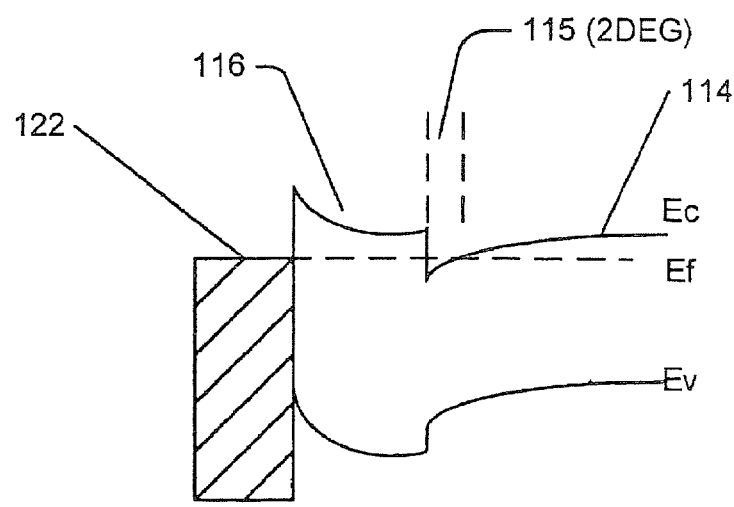
FIG. 15 is an illustrative graph of the band diagram of a region within the structure illustrated in FIG. 14.

An illustrative band diagram for the structure of FIG. 12 is shown in FIG. 13. As illustrated in FIG. 13, a high field region 32, characterized by a steep positive slope of the conduction band, is formed by the quantum well provided by channel layer 14, the first layer 38 and the second layer 36. The electric field within the high field region 32 opposes the movement of carriers away from channel layer 14.

Embodiments of the present invention illustrated in FIG. 12 provide a GaN/InGaN/GaN (including GaN/InN/GaN) structure and, therefore, may provide a channel that is a binary for reduced alloy scattering. Furthermore, the GaN layer 36 may be easier to grow than ternary or quaternary materials, so a thicker, lower dislocation density layer could be made, particularly if GaN substrates become available for use. Furthermore, the electron source and hole source layer densities at interfaces should be approximately equal and cancel, thus, potentially making design easier.

Figure 16:
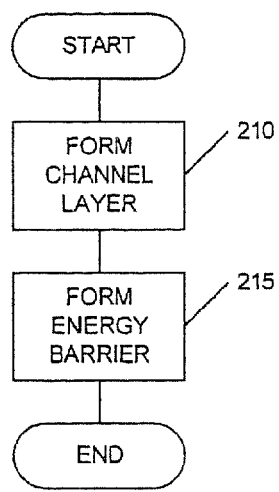
FIGS. 16-18 are flowcharts illustrating operations according to further embodiments of the invention.
Figure 17:
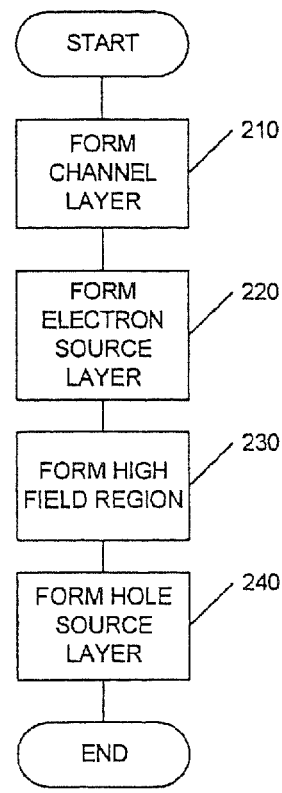
Figure 18:
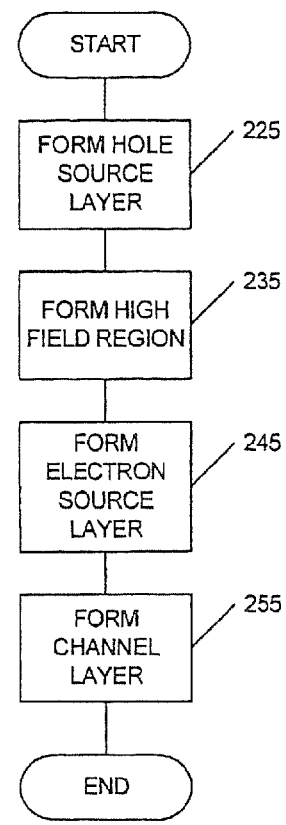

Method embodiments of the present invention are illustrated in FIGS. 16-18. As illustrated in FIG. 16, a method according to embodiments of the present invention includes forming a channel region (block 210) and forming an energy barrier that opposes the movement of carriers away from the channel region (block 215). Some embodiments of the invention include forming a channel region and forming an energy barrier that opposes the movement of carriers away from the channel region on each side of the channel region.

In some embodiments illustrated in FIG. 17, forming an energy barrier includes forming an electron source layer (block 220), forming a high field region (block 230) and forming a hole source layer (block 240). In some embodiments, the channel layer may be formed on the electron source layer. In other embodiments, the electron source layer may be formed after formation of the channel layer.

In particular embodiments illustrated in FIG. 18, a hole source layer is formed (block 225), a high field region is formed on the hole source layer (block 235), and an electron source layer is formed on the high field region (block 245). A channel layer is formed on the electron source layer (block 255). For HEMT structures, a barrier layer may be formed on the channel layer in order to facilitate generation of a 2DEG region between the channel layer and the barrier layer.

In other embodiments, a channel layer is formed, an electron source layer is formed on the channel layer, a high field region is formed on the electron source layer and a hole source layer is formed on the high field region.

The steps of forming a channel layer, forming an electron source layer, forming a high field region and forming a hole source layer are described in detail above. In particular, the step of forming an electron source layer may include delta-doping a thin layer of a nitride-based crystal with donor (n-type) impurities. For example, as discussed above, an electron source layer may be formed by doping a semiconductor crystal with a concentration of dopant atoms of about $10^{18}$ $cm^{-3}$ for a thickness of about 10 nm. Similarly, the step of forming a hole source layer may include delta-doping a thin layer of a nitride-based crystal with acceptor (p-type) impurities. As discussed above, the electron and hole source layers may be formed thicker or thinner than 10 nm. Moreover, the electron and hole source layers do not have to have the same thickness and/or doping levels.

Instead of forming an intentionally doped layer, the step of forming an electron source layer may be accomplished simultaneously with the formation of a 2DEG at a GaN/AlGaN interface. That is, the 2DEG region may act as the electron source layer for purposes of certain embodiments. Similarly, the step of forming a hole source layer may be accomplished by the formation of a heterointerface that acts as an acceptor-doped region due to piezoelectric effects as discussed above.

Figure 19:
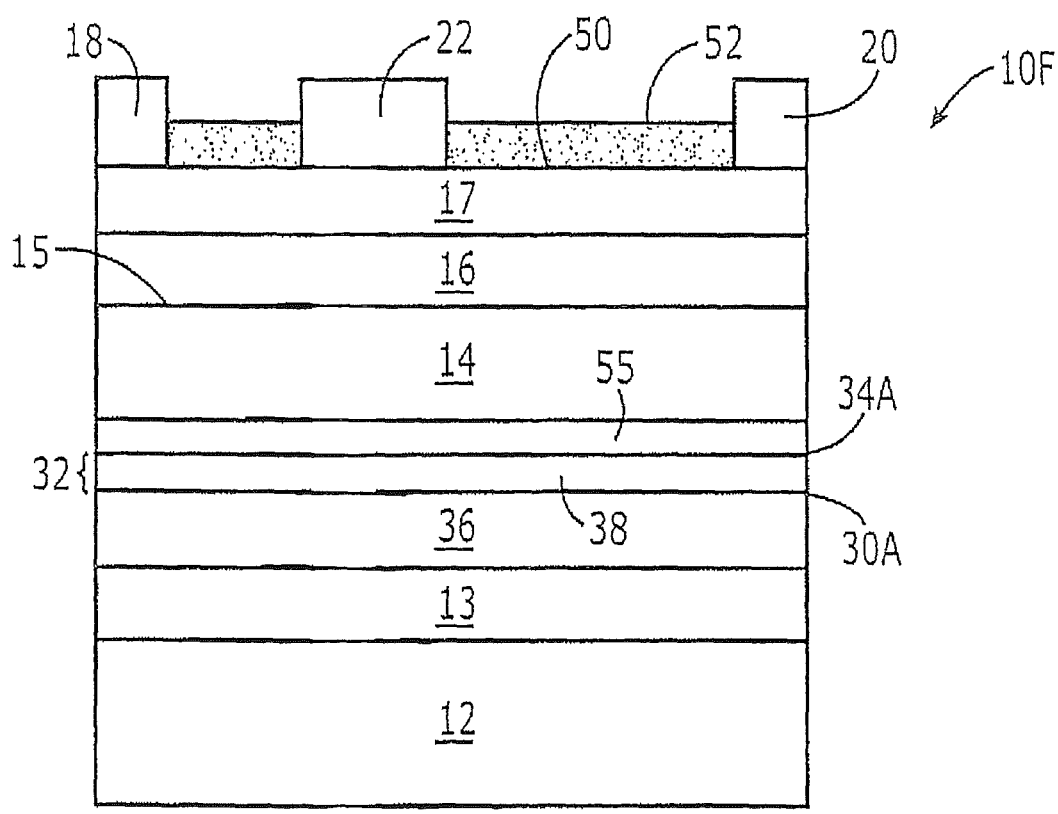
FIG. 19 is a schematic drawing showing a transistor structure according to still further embodiments of the present invention.

Additional embodiments of the present invention are illustrated in FIG. 19. As described in connection with structure 10E of FIG. 12, structure 10F of FIG. 19 includes a substrate 12, a buffer layer 13 (also referred to as a nucleation layer), a channel layer 14 and a barrier layer 16 which are formed as described above in connection with FIG. 1 and/or FIG. 12. Structure 10F also includes interface regions 30A and 34A between which a quantum well may be formed. In addition, a low temperature protective layer 55 may be provided between the channel layer 14 and the layer 38 (energy barrier or back barrier), and/or an upper cap layer 17 may be provided on the barrier layer 16. In structure 10F, the layer 38 (also referred to as an energy barrier or back barrier) has a narrower band gap and larger lattice constant than the channel layer 14 and the layer 36 so as to provide a quantum well that provides the barrier. In some embodiments of the present invention, the first layer 38 (energy barrier or back barrier) may be a layer of $In_xGa_{1-x}N$ (0<x≤1) and the channel layer 14 and second layer 36 may both be layers of GaN. For an $In_xGa_{1-x}N$ (0<x≤1) layer 38 (energy barrier or back barrier), the layer 38 may have a thickness in the range of about 10 Å (Angstroms) to about 50 Å (Angstroms). Moreover, for an $In_xGa_{1-x}N$ (0<x≤1) layer 38, a characteristic of the layer (such as a concentration of indium) may be graded and/or non-uniform laterally and/or vertically, and grading and/or non-uniformity may be intentionally induced and/or may result as a by-product of a process used.

The charge induced by an InN/GaN interface may be expected to be very high ($>2\times10^{14}$ $cm^{-2}$), so no more than ~2 monolayers may be desired for a large barrier. The interfaces 30A and 34A are the hole and electron source regions, respectively, and each may possess this very large charge density. Therefore, a very thin layer 38 (energy barrier or back barrier) may be capable of producing a large barrier as previously described. Also, the $In_xGa_{1-x}N$ (0<x≤1) layer 38 may be kept thin enough so that there may be no allowed energy levels fowled within the quantum well that may act as electron or hole traps. Accordingly, for a GaN/InN/GaN structure, the InN may be kept below ~2 monolayers for this reason. For a GaN/InGaN/GaN (or AlGaN/GaN/AlGaN or other InAlGaN/InAlGaN/InAlGaN) structure with a given barrier layer, a thickness of the layer 38 may be increased approximately linearly as the band offset is decreased to reduce and/or prevent accumulation of electrons in the well. A maximum allowable thickness for forbidding quantum levels within the well may scale only approximately as the square root of the thickness of the layer 38. Therefore, a large discontinuity in band gap may be desirable. Interface regions 30A and 34A may each be either abrupt or graded.

In certain of the embodiments illustrated in FIG. 19, the channel layer 14 may be a thin layer in the range of about 30 Å (Angstroms) to about 300 Å (Angstroms)—just thick enough to contain the 2DEG and allow enough thickness to switch to high quality GaN during the growth. In embodiments where the layer 38 is InN and/or $In_xGa_{1-x}N$ (0<x≤1), the low-temperature protective layer 55 may be optionally formed on the layer 38 (energy barrier or back barrier) before forming the channel layer 14. More particularly, the low temperature protective layer 55 and the channel layer 14 may both be layers of GaN, with the low temperature protective layer 55 being formed at a temperature that is at least about 100 degrees C. lower than a temperature at which the channel layer 14 is formed. More particularly, the low temperature GaN protective layer 55 may be formed at a temperature less than about 900 degrees C., and the GaN channel layer 14 may be formed at a temperature greater than about 1000 degrees C. By forming the low temperature protective layer 55 before forming the channel layer 14 at a higher temperature, the layer 38 (including indium) is not exposed when forming the channel layer 14 at a higher temperature, and damage to the layer 38 can be reduced. Moreover, the low temperature protective layer 55 may be considered as a portion of the channel layer 14.

By providing the layer 38 (energy barrier or back barrier) as a layer of $In_xGa_{1-x}N$ (0<x<1), as opposed to a layer of InN, manufacturability of the device may be increased. According to some embodiments of the present invention, a mole fraction of InN in an alloy of InN/GaN making up the layer 38 (energy barrier or back barrier) may be at least about 1% (percent), and more particularly, in the range of about 2% (percent) to about 20% (percent). Moreover, a concentration of indium in the layer 38 may vary in directions parallel and/or perpendicular with respect to a surface of the substrate, and/or the layer 38 may include InN and/or GaN dots (inclusions) therein.

Embodiments of the present invention illustrated in FIG. 19 may provide a GaN/InGaN/GaN and/or GaN/InN/GaN structure (of layers 36/38/14) and, therefore, may provide a channel layer formed of a binary compound semiconductor material which may result in reduced alloy scattering. Furthermore, the GaN layer 36 may be easier to grow than ternary or quaternary materials, so a thicker, lower dislocation density layer could be made, particularly if a GaN substrate is employed. Furthermore, the electron source and hole source layer charge densities at interfaces 30A and 34A should be approximately equal and cancel, thus, potentially making design easier.

According to some embodiments of the present invention, the substrate 12 may be a semi-insulating silicon carbide (SiC) of the 4H polytype, the buffer layer 13 (nucleation layer) may be a layer of AlN, the layer 36 may be a layer of GaN, the layer 38 (energy barrier or back barrier) may be a layer of $In_xGa_{1-x}N$ (0<x≤1), the low temperature protective layer 55 may be a layer of GaN, the channel layer 14 may be a layer of GaN, the barrier layer 16 may be a layer of AlN, and the cap layer 17 may be a layer of $Al_nGa_{1-n}N$ (0≤n≤1). Moreover, ohmic implants may be provided to improve contact with one or more of the source contact 18 and/or the drain contact 20, and/or the passivation layer 52 may be a layer of silicon nitride such as a High Purity Nitride (HPN).

As shown in FIG. 19, the source and drain contacts 18 and 20 may be provided on the cap layer 17. While not shown in FIG. 19, the source and drain contacts 18 and 20 may alloy and/or diffuse into the cap layer 17, the barrier layer 16, and/or the channel layer 14 as a result of thermal processing during and/or after forming the source and drain contacts 18 and 20. Moreover, portions of the gate contact 22 may provide a field plate extending laterally on surface portions of the passivation layer 52 opposite the substrate 12. According to particular embodiments of the present invention, the gate contact 22 may include a field plate extending laterally on the passivation layer 52 0.15 μm (micrometer) towards the drain contact 20 and 0.2 μm (micrometers) toward the source contact 18.

Particular structures according to embodiments of the present invention are illustrated in the table of FIG. 20. In FIG. 20, the column labels Sample1-Sample11 identify structures according to embodiments of the present invention, and the column labels Control1-Control2 identify examples of control structures without an $In_xGa_{1-x}N$ (0<x≤1) layer 38. The rows labeled Layer 17 (AlGaN), Layer 16 (AlN), Layer 14 (GaN), Layer 55 (LT GaN), Layer 38 (InGaN), and Layer 36 (GaN) identify the different layers of the structure of FIG. 19. As shown in FIG. 20, the cap layer 17 of FIG. 19 has a thickness of about 27 nm (nanometers) for Sample1-8 and for Control1-2 and a thickness of about 25 nm (nanometers) for Sample9-11. The cap layer 17 has a mole fraction of AlN in an AlN/GaN alloy of the cap layer of about 26% for Sample1-8 and Control1-2 and of about 28% for Sample 9-11. The barrier layer 16 has a thickness of about 0.7 nm (nanometers) for Sample1-8 and Control1-2, and a thickness of about 0.8 nm (nanometers) for Sample9-11. The channel layer 14 has: a thickness of about 8 nm (nanometers) for Sample1-2 and Control1; a thickness of about 9 nm (nanometers) for Sample5; and a thickness of about 10 nm (nanometers) for Sample3-4, Sample6-11, and Control1. The low temperature (LT) protective layer 55 has: a thickness of about 1 nm (nanometer) for Sample5; a thickness of about 2 nm (nanometers) for Sample1-2; and a thickness of about 7 nm (nanometers) for Control1. The low temperature protective layer 55 has been omitted (i.e., a thickness of 0) from Sample3-4, Sample6-11, and Control2.

The layer 38 (energy barrier or back barrier) has a thickness of about 5 nm (nanometers) for Samples1-11, and the layer 38 is omitted (i.e., a thickness of 0) from Control1-2. The layer 38 has a mole fraction of InN in an InN/GaN alloy of: about 4% for Sample1 and Sample4; about 6% for Sample5; about 8% for Sample2-3, Sample6, and Sample9-11; about 12% for Sample7; and about 16% for Sample8. The layer 38 was formed at a temperature of: about 699 degrees C. for Sample8; about 739 degrees C. for Sample7; about 779 degrees C. for Sample6 and Sample9; about 784 degrees C. for Sample2-3; about 804 degrees C. for Sample5; about 819 degrees C. for Sample10-11; and about 824 degrees C. for Sample1 and Sample4. Moreover, layer 38 of Sample9-10 was doped with silicon on the order of $5 \times 10^{17}$ per $cm^3$, and layer 38 of Sample11 was doped with silicon on the order of $2 \times 10^{18}$ per $cm^3$. Layer 36 in each of Sample1-11 and Control1-2 has a thickness of about 2000 nm (nanometers).

By providing a $In_xGa_{1-x}N$ (0<x≤1) layer 38 on the channel layer 14 opposite the barrier layer 16 (as in each of Sample1-11), a resulting polarization may improve charge confinement of the 2DEG at the interface of the channel and barrier layers 14 and 16. More particularly, the $In_xGa_{1-x}N$ (0<x≤1) layer 38 may form a charge dipole raising a conduction-band potential in the GaN layer 36. The $In_xGa_{1-x}N$ (0<x≤1) layer 38 is not required to be an active current carrying layer so that a quality $In_xGa_{1-x}N$ (0<x≤1) layer 38 may be relatively low. A concentration of indium in the $In_xGa_{1-x}N$ (0<x<1) layer 38 may thus vary in directions perpendicular and/or parallel with respect to a surface of the substrate 12, and/or the layer 38 may include InN and/or GaN dots (inclusions) therein. Moreover, the $In_xGa_{1-x}N$ (0<x≤1) layer 38 of each of Sample1-11 may provide a barrier in the range of about 0.2 eV to about 0.4 eV. In addition, a structure of each of Sample1-11 may be provided as a 0.5 μm (micrometer) stepper based HEMT.

According to some embodiments of the present invention, the barrier layer 16 may have a thickness in the range of about 0.1 nm to about 10 nm, and more particularly, in the range of about 0.7 nm to about 0.8 nm, and/or the barrier layer 16 may be separated from the energy barrier 38 by a distance in the range of about 5 nm to about 30 nm, and more particularly, in the range of about 5 nm to about 20 nm, and still more particularly in the range of about 10 nm to about 15 nm. According to some embodiments of the present invention, the channel layer 14 may have a thickness in the range of about 1 nm to about 20 nm, and more particularly in the range of about 8 nm to about 10 nm, and/or the GaN protective layer 55 may have a thickness of about 15 nm or less, and more particularly, of about 7 nm or less. According to some embodiments of the present invention, the energy barrier 38 may have a thickness in the range of about 0.1 nm (1 Angstrom) to about 10 nm (100 Angstrom), and more particularly, in the range of about 1 nm (10 Angstrom) to about 5 nm (50 Angstrom). According to some embodiments of the present invention, a mole fraction of InN (indium nitride) in an InN/GaN alloy of the energy barrier may be in the range of about 1% to about 50%, and more particularly, in the range of about 4% to about 16%.

Figure 21A:
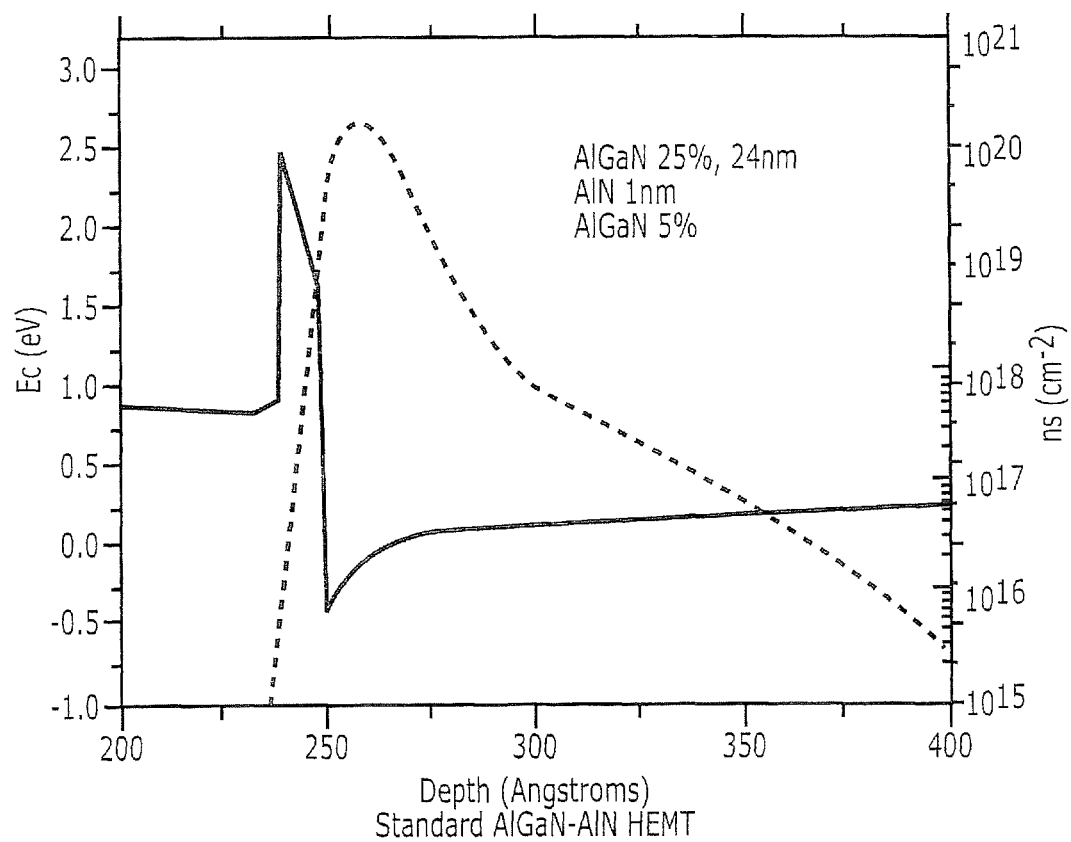
FIG. 21A is a band diagram for a HEMT without an InGaN energy barrier layer.
Figure 21B:
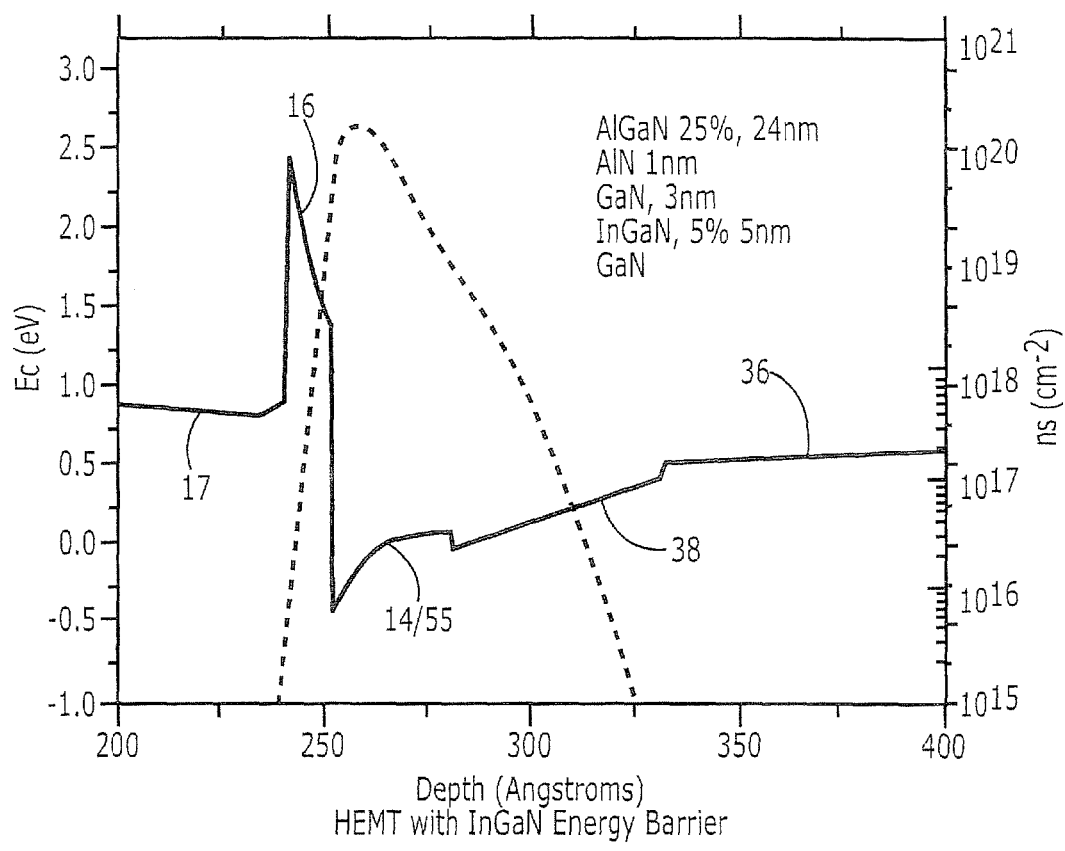
FIG. 21B is a band diagram for a HEMT including an InGaN energy barrier layer according to embodiments of the present invention.

The band diagrams of FIGS. 21A-B illustrate a potential impact of including the $In_xGa_{1-x}N$ (0<x≤1) layer 38 that may provide charge confinement. FIG. 21A is a band diagram for a structure including a 24 nm (nanometer) thick AlGaN cap layer (having a mole fraction of AlN in an AlN/GaN alloy of about 25%), a 1 nm (nanometer) AlN barrier layer, and an AlGaN channel layer (having a mole fraction of AlN in an AlN/GaN alloy of about 5%) without an $In_xGa_{1-x}N$ (0<x≤1) layer 38. FIG. 21B is a band diagram for a structure including a 24 nm (nanometer) thick AlGaN cap layer 17 (having a mole fraction of AlN in an AlN/GaN alloy of about 25%), a 1 nm (nanometer) AlN barrier layer 16, a 3 nm (nanometer) thick GaN channel layer 14, a 5 nm thick $In_xGa_{1-x}N$ (0<x≤1) layer 38 (having a mole fraction of InN in an InN/GaN alloy of about 5%), and a GaN layer 36 as shown in FIG. 19.

Without the $In_xGa_{1-x}N$ (0<x≤1) layer 38, the electron distribution (dashed line) may extend well into a buffer region as shown in FIG. 21A. With the $In_xGa_{1-x}N$ (0<x≤1) layer 38, the electron distribution (dashed line) may be reduced by more than half as shown in FIG. 21B. The solid lines of FIGS. 21A-B illustrate conduction bands for the respective structures. The reference numbers of FIG. 21B indicate portions of the conduction band graph of FIG. 21B corresponding to the layers of the structure shown in FIG. 19.

Figure 22:
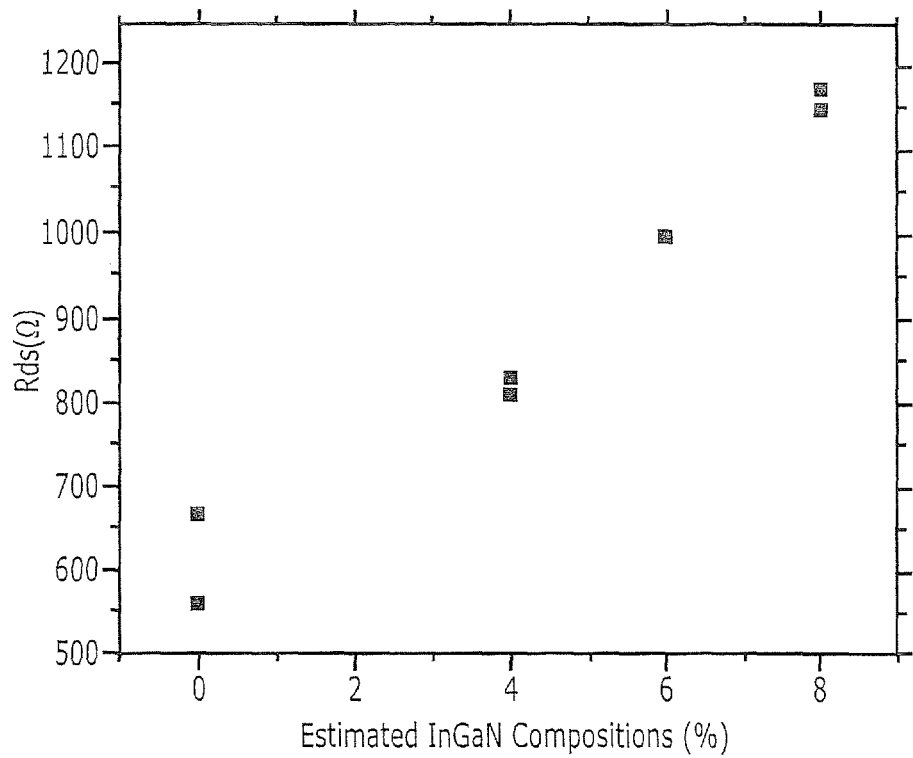
FIG. 22 is a graph showing output resistances (Rds) for HEMTs having different estimated compositions of InGaN barrier layers according to embodiments of the present invention.

Drain-source output resistances Rds (measured in ohms) are provided in FIG. 22 as a function of estimated InGaN compositions for the $In_xGa_{1-x}N$ (0<x≤1) layer 38 of Sample1-6 and Control1-2 from the table of FIG. 20. As shown, the structures of Control1-2 without layer 38 may provide the lowest output resistances. When the $In_xGa_{1-x}N$ (0<x≤1) layer 38 is included (as in Sample1-6), the output resistance may increase with increasing concentrations of indium in the $In_xGa_{1-x}N$ (0<x≤1) layer 38. The high output resistance Rds may be an indication of reduced short-channel effects, and devices with higher output resistances may be expected to provide higher gain and/or Power Added Efficiency (PAE), especially when implemented in sub 0.2 μm (micrometer) gate length HEMTs for mm-wave applications.

As shown in FIG. 22, drain-source output resistances Rds may be increased in structures including energy barriers according to embodiments of the present invention as compared to structures of similar dimensions and materials without energy barriers. For example, drain-source output resistances Rds may be increased by 10%, 50%, or even 100% as compared to structures of similar dimensions and materials but without an energy barrier.

Confinement may be improved with improved quality of the $In_xGa_{1-x}N$ (0<x≤1) layer 38, and a relatively thin $In_xGa_{1-x}N$ (0<x≤1) layer 38 with a relatively high In (indium) mole fraction may provide a relatively high dipole and improved confinement. A high indium (In) content $In_xGa_{1-x}N$ (0<x≤1) layer 38, however, may be difficult to grow with high crystal quality. An effective $In_xGa_{1-x}N$ (0<x≤1) layer 38 (energy barrier or back barrier) may be provided with a relatively low In content (for example, having a mole fraction of InN in an InN/GaN alloy of about 5%) and a thickness in the range of about 10 Å (Angstroms) to about 50 Å (Angstroms).

Heterojunction transistors (such as HEMTs) according to embodiments of the present invention may be formed by forming an epitaxial nucleation layer 13 (such as an AlN nucleation layer) on a single crystal substrate (such as a 4H—SiC substrate). An epitaxial Group III nitride layer 36 (such as a layer of GaN may be formed on the nucleation layer 13, and an epitaxial Group III nitride energy barrier layer 38 (such as a layer of $In_xGa_{1-x}N$ where 0<x≤1 or where 0<x<1) may be formed on the layer 36.

An epitaxial Group III nitride low temperature protective layer 55 (such as a layer of InAlGaN) may be formed on the energy barrier layer 38, and an epitaxial Group III nitride channel layer 14 (such as a layer of InAlGaN) may be formed on the low temperature protective layer 55. More particularly, the low temperature protective layer 55 may be formed at a temperature at least 100 degrees C. less than a temperature at which the channel layer 14 is formed. For example, the low temperature protective layer 55 may be formed at a temperature in the range of about 600 degrees C. to about 800 degrees C., and the channel layer 14 may be formed at a temperature of at least about 1000 degrees C. The low temperature protective layer 55 may thus protect the energy barrier layer 38 during the subsequent step of forming the channel layer 14, and the low temperature protective layer 55 may be considered a part of the channel layer 14. After forming the channel layer 14, an epitaxial Group III nitride barrier layer 16 (such as a layer of InAlGaN) may be formed on the channel layer 14, and an epitaxial Group III nitride cap layer 17 (such as a layer of InAlGaN) may be formed on the barrier layer 16. After forming the cap layer 17, source, gate, and drain contacts 18, 22, and 20 and passivation layer 52 may be formed.

More particularly, Group III nitride compositions of the energy barrier layer 38, the channel layer 14, the barrier layer 16, and the cap layer 17 may vary. For example, a concentration of gallium in the cap layer 17 may be greater than a concentration of gallium in the barrier layer 16. A concentration of aluminum in the barrier layer 16 may exceed a concentration of aluminum in the channel layer 14 and/or the low temperature protective layer 55. Moreover, a concentration of indium in the energy barrier layer 38 may exceed a concentration of indium in the channel layer 14 and/or the low temperature protective layer 55. For example, the energy barrier layer 38 may comprise a layer of $In_xGa_{1-x}N$ (0<x≤1), the channel layer 14 may comprise a layer of $Al_yGa_{1-y}N$ (0≤y<1), and the barrier layer 16 may comprise a layer of $Al_zGa_{1-z}N$ (0<z≤1), and x, y, and/or z may be different. More particularly, the energy barrier layer 38 may comprise a layer of $In_xGa_{1-x}N$ (0<x<1), the channel layer 14 may comprise a layer of GaN, the barrier layer 16 may comprise a layer of AlN, and the cap layer 17 may comprise a layer of $Al_nGa_{1-n}N$ (0<n<1).

HEMT structures according to embodiments of the present invention may provide improved power performance, for example, for mm-wave amplifiers for satellite communication, mm-wave WLAN (Wireless Local-Area Network), Digital Radio, solid-state amplifiers for vacuum tube replacement, and/or high frequency amplifiers for test and measurement applications. Power levels of 5 to 10 times that currently available using gallium-arsenide (GaAs) and/or indium-phosphorus (InP) transistors may be provided by HEMT structures according to embodiments of the present invention with relatively high efficiency and/or high power mm-wave amplifier operation.

By including the $In_xGa_{1-x}N$ ($0<x\leq1$) layer 38 in HEMT structures according to embodiments of the present invention, output characteristics may be improved by providing confinement from the backside of the GaN HEMT channel layer 14. Performance may be improved for HEMT structures operating at radio frequency (RF) and/or microwave frequencies, and even more significant improvements may be provided for HEMT structures operating at higher frequencies. As gate lengths are scaled down for higher frequency operations, device output conductance may be reduced linearly. Although on-resistance may also decrease due to dimensional shrinkage, the reduction may be at a much lower rate so that power gain may be compromised, and improvement of extrinsic cut-off frequency $f_{max}$ with respect to $f_t$ may be less than desired. Moreover, a sub-threshold leakage may increase when the gate length is below 0.25 μm (micrometers) so that Power Added Efficiency (PAE) is reduced.

In alternatives, an energy barrier (or back barrier) may be provided using AlGaN based buffer layers. AlGaN layers, however, may tend to be unintentionally doped, and dopant compensation may cause deep traps. Moreover, a crystal quality of bulk AlGaN may generally be less than a crystal quality of currently available GaN, because the crystal formation process for AlGaN may be more complicated and may be subjected to alloy disorder. A layer of AlGaN may be provided between the 2-DEG and a relatively high quality GaN buffer, but a buried sub-channel may form at the first AlGaN/GaN interface. Grading the AlGaN from the GaN buffer may reduce the sub-channel while generating bulk polarization charges, possibly reducing confinement.

Exemplary embodiments described herein having heterostructures as a hole or electron source are illustrated with respect to Ga-polar epitaxial layers. For exemplary embodiments relying on doping to provide a hole and/or source layer, such structures would be the same for non-polar or partially Ga polar. However, typically, non-polar structures would not be able to take advantage of heterointerface polarization doping. Embodiments of the present invention employing N-polar structures would look different in terms of the heterostructure layers, although the same principles apply, just reversed.

Figure 23B:
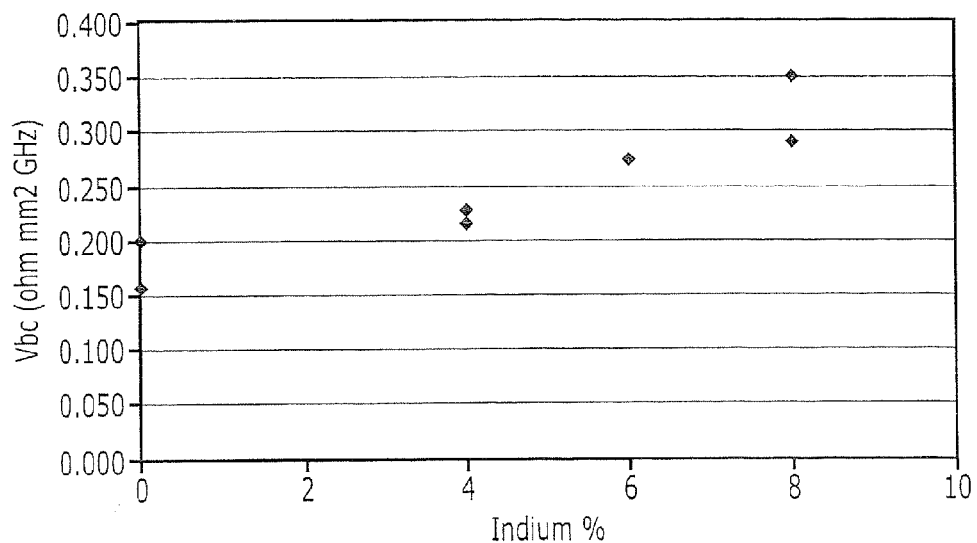
FIGS. 23b-c are graphs illustrating back-confinement values Vbc and device resistances Dr, respectively, as functions of a percentage of Indium in the InGaN layer in the structures of FIG. 23a according to embodiments of the present invention.
Figure 23C:
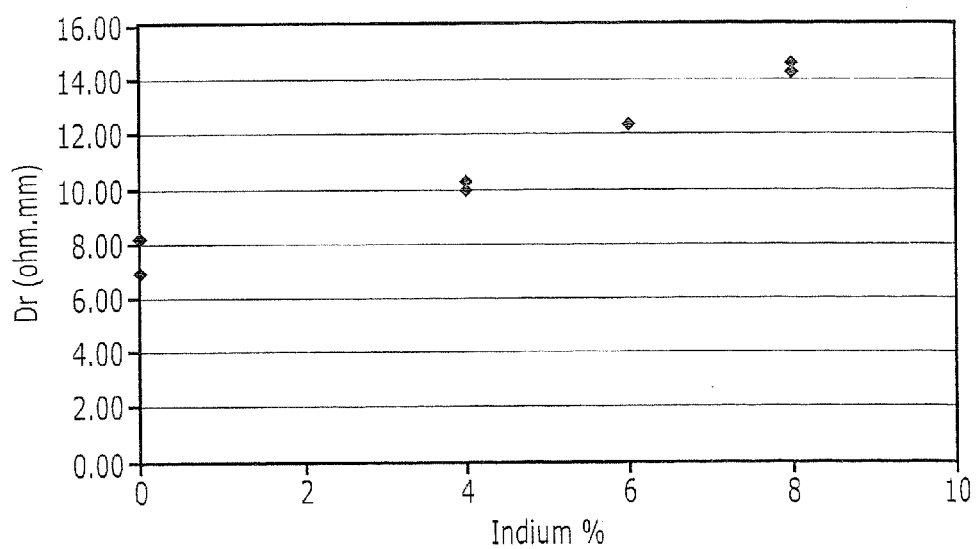

The table of FIG. 23a provides drain-source resistances Rds in ohm mm, unity gain frequencies Ft, intr (i.e., frequencies at which current gain is 1, also referred to as Ft) in GHz, back-confinement values Vbc in ohm $mm^2$ GHz, device resistances Dr in ohm mm, and percentages of Indium in the InGaN layers 38 for the devices Sample1-5 and Control1-2 from the table of FIG. 20. The graph of FIG. 23b illustrates back-confinement values Vbc as a function of percentage of Indium in the InGaN layer for the devices of FIG. 23a. The graph of FIG. 23c illustrates device resistances Dr as a function of percentage of Indium in the InGaN layer for the devices of FIG. 23a. As shown in FIGS. 23b and 23c, both back-confinement values Vbc and device resistances Dr may improve with increasing Indium percentages.

The gate contacts 22 of the devices represented in the tables of FIGS. 20 and 23a include a field plate extending laterally on the passivation layer 52 0.15 μm (micrometer) towards the drain contact 20 and 0.2 μm (micrometers) toward the source contact 18. The InGaN Layer 38 has a thickness of 5 nm and varying mole fractions of InN in the InN/GaN alloy (defined by the indicated percentage) for each of Sample1-5, according to embodiments of the present invention. As discussed above, the percentage of Indium in the InGaN layers 38 is an estimate of a mole fraction of InN in an InN/GaN alloy of the InGaN layers 38 with the estimates being determined using photoluminescence (PL). The InGaN Layer 38 is omitted from the control structures Control1-Control2. For each of the structures of FIG. 23a: Rds is the drain-source output resistance measured in ohm mm; Ft,intr (also referred to as Ft) is the frequency at which current gain is 1 measured in GHz; Vbc is the back-confinement value measured in ohm $mm^2$ GHz; and Dr is the device resistance measured in ohm mm.

The gate length Lg is the distance from one side of the gate contact 22 adjacent the drain contact 18 to the other side of the gate contact 22 adjacent the source contact 20 shown in FIG. 19 in a direction parallel to the page of FIG. 19. The gate width Wg (also referred to as the channel width) is the distance from one end of the gate contact 22 along the channel to a second end of the gate contact 22 along the channel in a direction perpendicular to the page of FIG. 19. The separation between the gate contact 22 and the two dimensional electron gas (2DEG) is designated as d, and the separation d is approximately equal to the combined thicknesses of the cap layer 17 and the barrier layer 16.

A back-confinement value Vbc may define a confinement of the two dimensional electron gas at a particular frequency Ft, and the InGaN layer 55 according to embodiments of the present invention may provide improved back-confinement values. More particularly, back-confinement values may be calculated as shown below:

$$Vbc = Rds*Ft*d.$$

The back-confinement value Vbc as calculated above may also represent a confinement potential per unit area of sheet-charge density (V/Ns*q) where V is the confinement potential, Ns is the sheet charge, and q is the unit electron charge.

In the structures of FIG. 23a, the gate length Lg for each of the devices was about 0.55 μm (micrometers), and the gate width Wg for each of the devices was about 246 μm (or 0.246 mm). Of the devices of FIGS. 23a-c including a 5 nm thick InGaN layer 38 according to embodiments of the present invention, Sample3 may provide the highest back-confinement value Vbc as calculated below:

$$Vbc(\text{Sample3}) = (287.8 \text{ ohm mm})(27.7*10^{-6} \text{ mm})(44 \text{ GHz}) = 0.35 \text{ ohm mm}^2 \text{ GHz}$$

Of the device of FIGS. 23a-c including a 5 nm thick InGaN layer 38 according to embodiments of the present invention, Sample4 may provide the lowest back-confinement value Vbc as calculated below:

$$Vbc(\text{Sample4}) = (197.8 \text{ ohm mm})(27.7*10^{-6} \text{ mm})(39 \text{ GHz}) = 0.21 \text{ ohm mm}^2 \text{ GHz}$$

Of the devices (Control1 and Control2) of FIGS. 23a-b without a back barrier InGaN layer, the lowest back-confinement values Vbc may be calculated as shown below:

$$Vbc(\text{Control1}) = (163.3 \text{ ohm mm})(27.7*10^{-6} \text{ mm})(44 \text{ GHz}) = 0.20 \text{ ohm mm}^2 \text{ GHz}$$

$$Vbc(\text{Control2}) = (137.3 \text{ ohm mm})(27.7*10^{-6} \text{ mm})(41 \text{ GHz}) = 0.16 \text{ ohm mm}^2 \text{ GHz}$$

According to embodiments of the present invention a heterojunction transistor may include a channel layer 14 of a Group III nitride, a barrier layer 16 of a Group III nitride on the channel layer 14 wherein the barrier layer 16 has a bandgap greater than a bandgap of the channel layer 14, a gate contact 22 on the barrier layer 16 so that the barrier layer 16 is between the gate contact 22 and the channel layer 14, and source and drain contacts 18 and 20 on opposite sides of the gate contact 22. In addition, an energy barrier 38 of InGaN may be provided on the channel layer 14 so that the channel layer 14 is between the energy barrier 38 and the barrier layer 16, and the energy barrier 38 may be configured to provide a back confinement value Vbc of at least about 0.21 ohm mm$^2$ GHz, and more particularly, a back confinement value Vbc of at least about 0.3 ohm mm$^2$ GHz. Moreover, the energy barrier 38 may be configured to provide back confinement values Vbc of at least approximately 0.21 ohm mm$^2$ GHz for unity gain frequencies Ft of at least about 35 GHz.

In addition, a device resistance Dr may be defined as a function of drain-source output resistance Rds, gate length Lg, and the separation d between the gate contact 22 and the two dimensional electron gas (2DEG). More particularly, device resistance Dr may be calculated as shown below:

$$Dr = Rds*d/Lg.$$

In the structures of FIGS. 23a-c, the gate length Lg for each of the devices was about 0.55 µm (micrometers), and the separation d for each of the devices was about 27 nm. Of the devices of FIGS. 23a-c including a 5 nm thick InGaN layer 38 according to embodiments of the present invention, Sample3 may provide the highest device resistance Dr as calculated below:

$$Dr(\text{Sample3}) = (287.8 \text{ ohm mm})(27.7 \text{ nm})/(550 \text{ nm}) = 14.5 \text{ ohm mm}$$

Of the device of FIGS. 23a-c including a 5 nm thick InGaN layer 38 according to embodiments of the present invention, Sample4 may provide the lowest device resistance Dr as calculated below:

$$Dr(\text{Sample4}) = (197.8 \text{ ohm mm})(27.7 \text{ nm})/(550 \text{ nm}) = 10 \text{ ohm mm}$$

Of the devices (Control1 and Control2) of FIGS. 23a-c without a back barrier InGaN layer, the device resistances Dr may be calculated as shown below:

$$Dr(\text{Control1}) = (163.3 \text{ ohm mm})(27.7 \text{ nm})/(550 \text{ nm}) = 8.2 \text{ ohm mm}$$

$$Dr(\text{Control2}) = (137.3 \text{ ohm mm})(27.7 \text{ nm})/(550 \text{ nm}) = 6.9 \text{ ohm mm}$$

According to embodiments of the present invention a heterojunction transistor may include a channel layer 14 of a Group III nitride, a barrier layer 16 of a Group III nitride on the channel layer 14 wherein the barrier layer 16 has a bandgap greater than a bandgap of the channel layer 14. A gate contact 22 may be provided on the barrier layer 16 so that the barrier layer 16 is between the gate contact 22 and the channel layer 14, and source and drain contacts 18 and 20 may be provided on opposite sides of the gate contact 22. In addition, an energy barrier 38 of InGaN may be provided on the channel layer 14 so that the channel layer 14 is between the energy barrier 38 and the barrier layer 16, and the energy barrier 38 may be configured to provide a device resistance Rd of at least about 9 ohm mm, and more particularly, a device resistance Rd of at least about 14 ohm mm.

As shown in the table of FIG. 23a, devices including InGaN back barrier layers according to embodiments of the present invention may provide higher on drain-source resistance Rds than devices without back barrier layers. Devices including InGaN back barrier layers according to embodiments of the present invention may provide a drain-source resistance Rds of at least about 170 ohm mm, and more particularly, a drain-source resistance Rds of at least about 240 ohm mm.

Figure 24A:
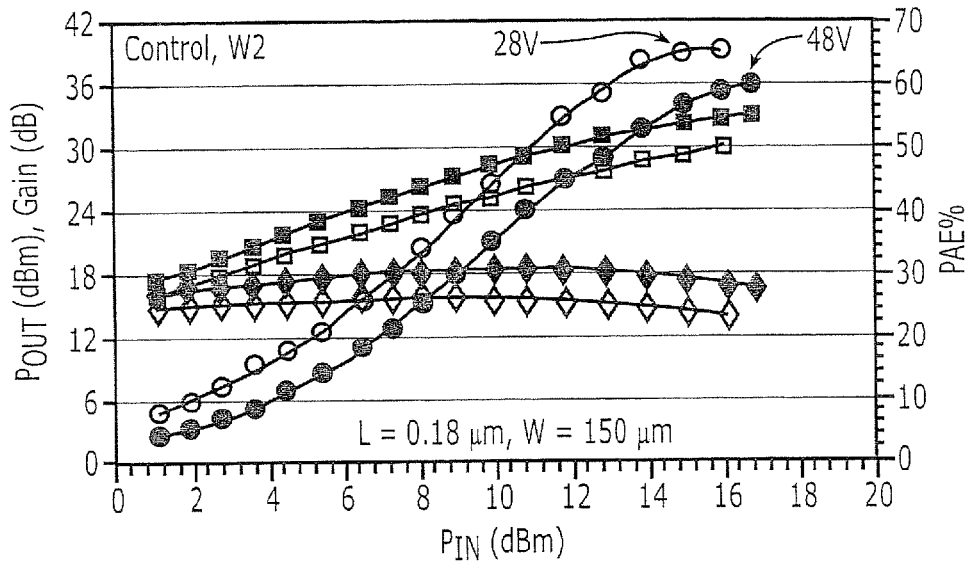
FIGS. 24a-b include graphs illustrating gain, power out, and power added efficiency for control HEMT structures and for HEMT structures according to embodiments of the present invention.
Figure 24B:
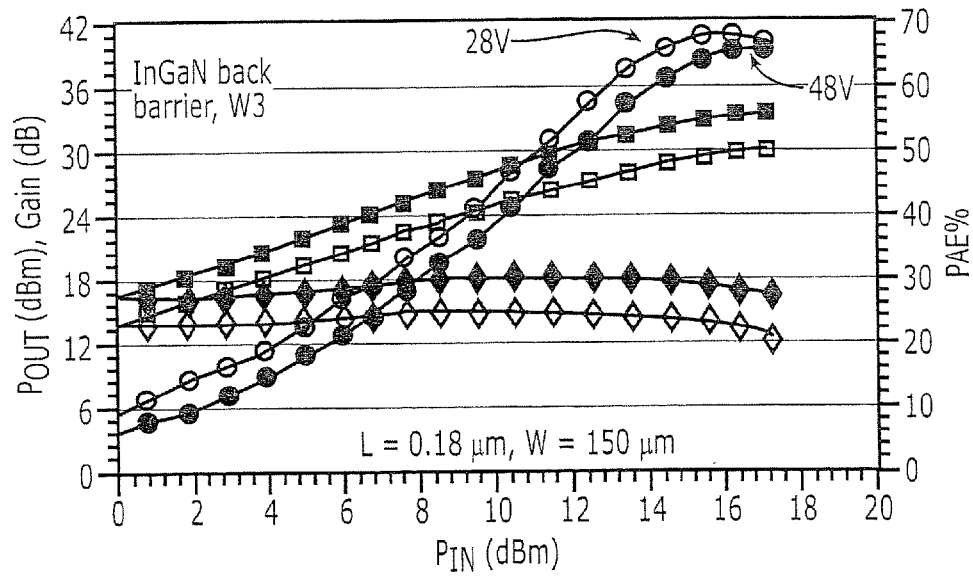

The graphs of FIG. 24a illustrate gain (G), power out ($P_{OUT}$), and power added efficiency (PAE) at 28 V Vds (drain-source voltage) and at 48 V Vds for a control device having a gate length Lg of 0.18 µm and a gate width Wg of 150 µm without an InGaN back barrier layer. The graphs of FIG. 24b illustrate gain (G), power out ($P_{OUT}$), and power added efficiency (PAE) at 28 V Vds (drain-source voltage) and at 48 V Vds for a device having a gate length Lg of 0.18 µm and a gate width Wg of 150 µm with an InGaN back barrier layer according to embodiments of the present invention. In each of FIGS. 24a and 24b, circles are used to graph power added efficiency (PAE), diamonds are used to graph gain (G), and squares are used to graph power out ($P_{OUT}$). Moreover, open circles, diamonds, and squares are used for graphs at 28 V Vds; and closed circles, diamonds, and squares are used for graphs at 48 V Vds. The X-axis of the graphs of FIGS. 24a and 24b represent power in ($P_{IN}$)

Figure 25A:
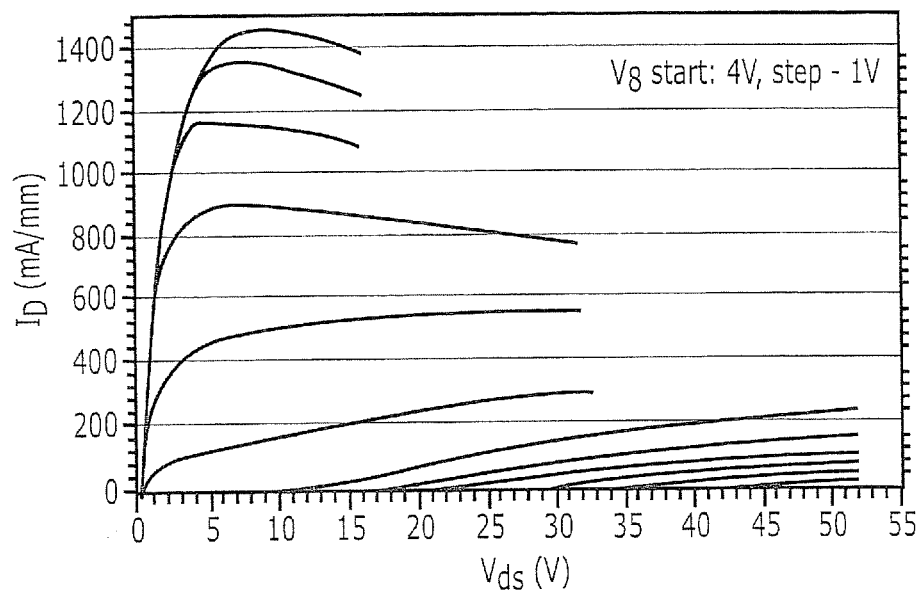
FIGS. 25a-b include graphs illustrating drain currents for control HEMT structures and for HEMT structures according to embodiments of the present invention.
Figure 25B:
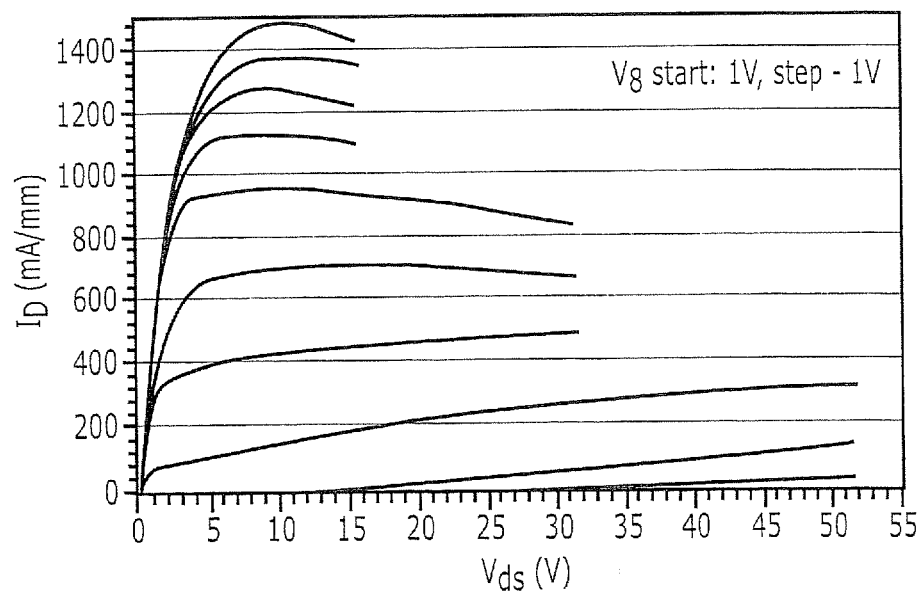

The graphs of FIG. 25a illustrate drain currents ($I_D$) as a function of drain-source voltage ($V_{DS}$) at different gate-source voltages (Vgs) for the control device discussed above with respect to FIG. 24a. A gate-source voltage of 4 V was provided for the uppermost graph, with a decrease of 1 V of Vgs being provided for each successive graph of FIG. 25a. The graphs of FIG. 25b illustrate drain currents ($I_D$) as a function of drain-source voltage ($V_{DS}$) at different gate-source voltages (Vgs) for the device including an InGaN back barrier according to embodiments of the present invention as discussed above with respect to FIG. 24b. A gate-source voltage of 4 V was provided for the uppermost graph, with a decrease of 1 V of Vgs being provided for each successive graph of FIG. 25a.

As shown in the graphs of FIGS. 24b and 25b, the device including the InGaN back barrier according to embodiments of the present invention may provide improved power added efficiency and/or power output at high Vds (e.g., at Vds=48 V) due to relatively sharp pinch-off at high voltages. HEMT devices including InGaN back barrier layers according to embodiments of the present invention may provide about 14.1 W/mm and 65.6% PAE at 48 V Vds.

Figure 26:
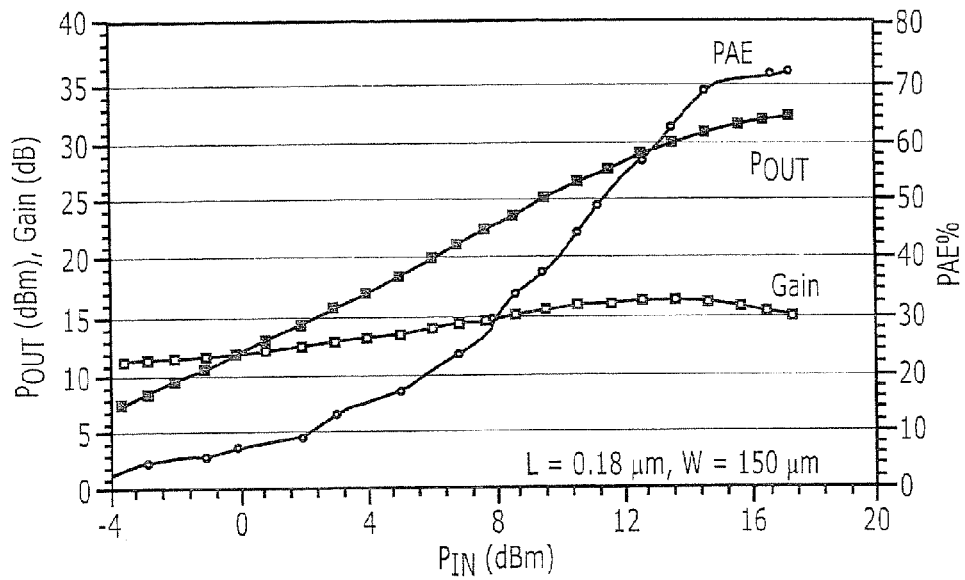
FIG. 26 includes graphs illustrating power added efficiency, power out, and gain as functions of power in for HEMT structures according to embodiments of the present invention.
Figure 27:
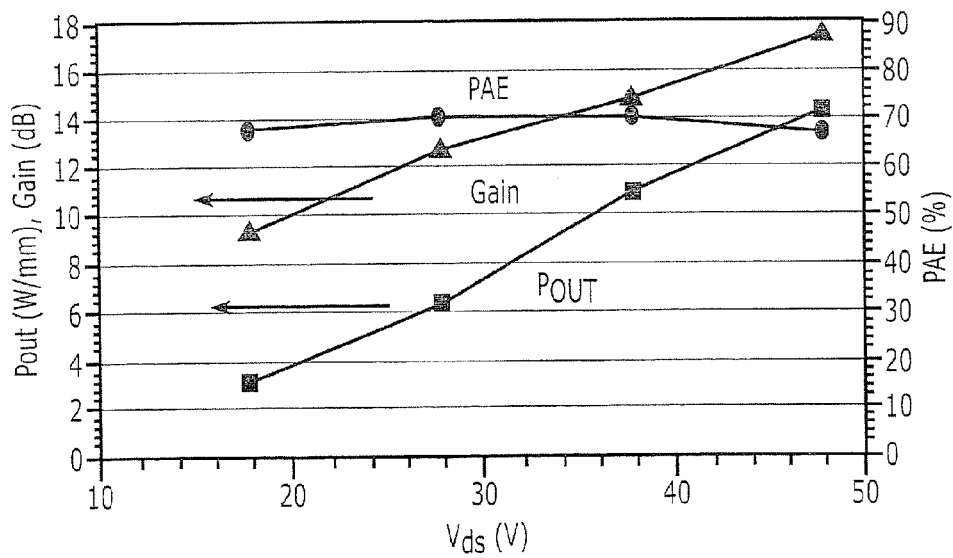
FIG. 27 includes graphs illustrating power added efficiency, power out, and gain as functions of drain-source voltage for HEMT structures according to embodiments of the present invention.

The graphs of FIG. 26 illustrate power added efficiency (PAE), power out (Pout), and gain (G) as functions of power in (Pin) for a HEMT structure having a 0.18 µm gate length (Lg) and a 150 µm gate width (Wg) according to embodiments of the present invention. The graphs of FIG. 27 illustrate power added efficiency (PAE), power out (Pout), and gain (G) as functions of drain-source voltage (Vds) for a HEMT structure having a 0.18 µm gate length (Lg) and a 150 µm gate width (Wg) according to embodiments of the present invention. As shown in FIGS. 26 and 27, HEMT structures according to embodiments of the present invention may provide at least 70% power added efficiency (PAE) and at least 10 W/mm power out (Pout) at a drain-source voltage (Vds) of about 38 V and at an operating frequency of about 10 GHz. More particularly, HEMT structures of FIGS. 26 and 27 may provide about 10.9 W/mm, about 70% power added efficiency, and about 14 dB of gain at a drain-source voltage (Vds) of about 38 V and at an operating frequency of about 10 GHz. Improved power added efficiency and power scaling may be provided according to embodiments of the present invention.

Figure 28:
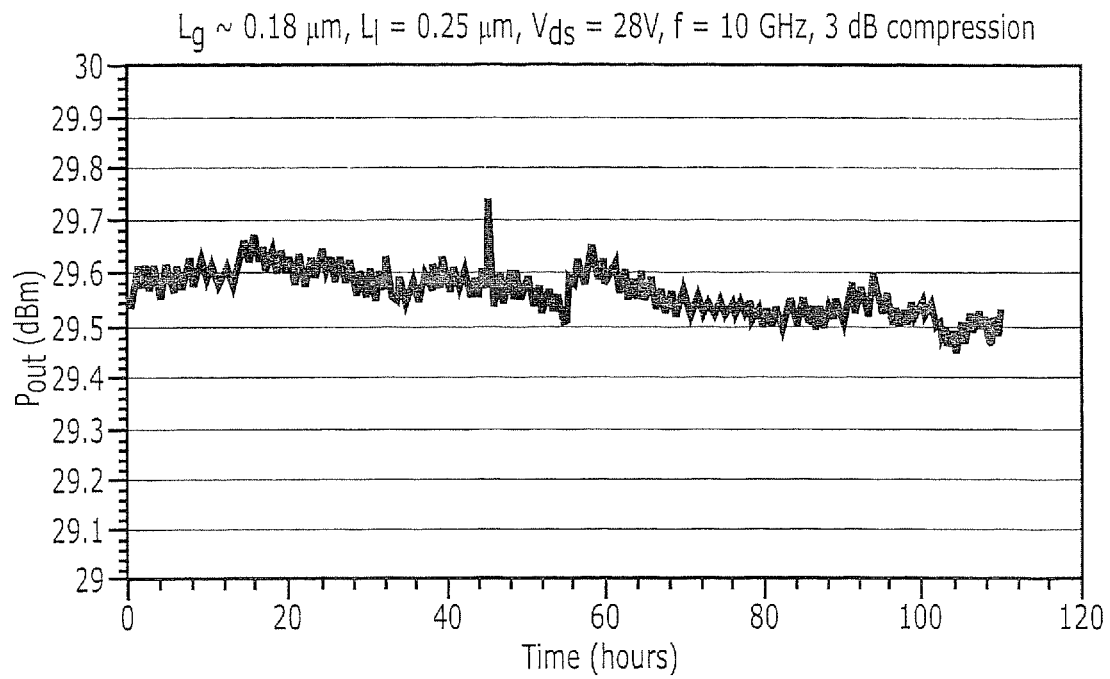
FIG. 28 includes a graph illustrating power out as a function of time for HEMT structures according to embodiments of the present invention.

The graph of FIG. 28 illustrates power out (Pout) as a function of time for HEMT structures according to embodiments of the present invention including a gate length Lg of 0.18Φm. As shown, HEMT structures according to embodiments may provide improved Room Temperature Operating Lifetime (RTOL) stability at a drain-source voltage (Vds) of 28 V. More particularly, less than 0.1 dB reduction of power out Pout may occur at room temperature operation at a drain-source voltage (Vds) of 28 V, at 5.5 W/mm power out, and at a 70% PAE operating point.

Figure 29:
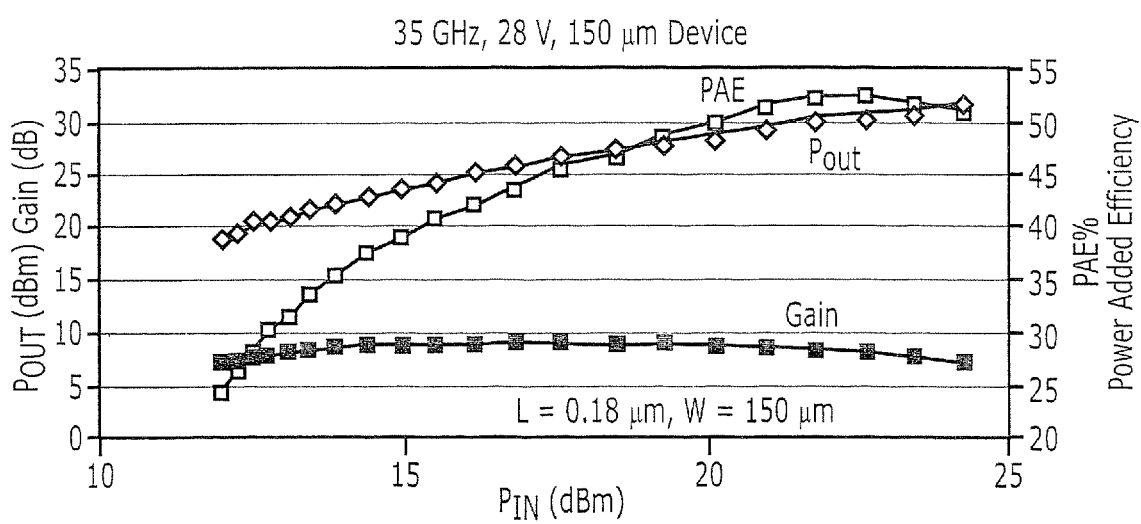
FIG. 29 includes graphs illustrating power added efficiency, power out, and gain as functions of power in for HEMT structures according to embodiments of the present invention.

The graphs of FIG. 29 illustrate power added efficiency (PAE), power out (Pout), and gain (G) as functions of power in (Pin) for a HEMT structure having a 0.18 μm gate length (Lg) and a 150 μm gate width (Wg) according to embodiments of the present invention. The HEMT structure of FIG. 29 including an InGaN back barrier layer may provide at least 50% PAE and 7 W/mm at 28 V drain-source voltage (Vds) and 35 GHz operating frequency. More particularly, the HEMT structure of FIG. 29 may provide about 52% PAE and about 7W/mm at a 28 V drain-source voltage (Vds), 35 GHz operating frequency, and 7.5 dB Large Signal (LS) gain.

The HEMT structure according to embodiments of the present invention used to provide the information of FIGS. 24b, 25b, 26, 27, 28, and 29 has the structure illustrated in FIG. 19. More particularly, the HEMT structure of FIGS. 24b, 25b, 26, 27, 28, and 29 includes an SiC substrate 12, an InAlGaN buffer layer 13, a GaN layer 36, an InGaN energy/back barrier layer 38 having a thickness of about 5 nm (with a mole fraction of about 8% of InN in the InN/GaN alloy making up the InGaN layer 38 and doped with Silicon at a concentration of about 2E18 $cm^{-3}$), a GaN layer 14 having a thickness of about 10 nm, an AlN layer 16 having a thickness of about 0.8 nm, and an AlGaN layer 17 having a thickness of about 25 nm (with a mole fraction of 28% of AlN in the AlN/GaN alloy making up the AlGaN layer 17). The low temperature GaN layer 55 is omitted. Moreover, the gate 22 may have a length Lg of about 0.18 μm and a width Wg of about 150Φm. In addition, the gate contact 22 may include a field plate extending laterally on the passivation layer 52 0.15 μm (micrometer) towards the drain contact 20 and 0.2 μm (micrometers) toward the source contact 18.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A heterojunction transistor comprising:
   a channel layer comprising a Group III nitride;
   a barrier layer comprising a Group III nitride on the channel layer wherein the barrier layer has a bandgap greater than a bandgap of the channel layer;
   a buffer layer comprising iron doped Group III nitride, wherein the channel layer is between the barrier layer and the buffer layer;
   a gate contact on the barrier layer so that the barrier layer is between the gate contact and the channel layer;
   source and drain contacts on opposite sides of the gate contact, wherein the source and drain contacts are spaced apart from the gate contact; and
   an energy barrier comprising a layer of a Group III nitride between the channel layer and the buffer layer, wherein the channel layer is between the barrier layer and the energy barrier, wherein the energy barrier has a narrower bandgap than the channel layer, wherein the layer of the Group III nitride of the energy barrier comprises a layer of an InN/GaN alloy, wherein a mole fraction of InN (indium nitride) in the InN/GaN alloy of the energy barrier is in the range of about 1% to about 50%, wherein the heterojunction transistor comprising the channel layer, the barrier layer, the gate contact, the source and drain contacts, and the energy barrier is configured to provide a back confinement value of at least about 0.21 ohm $mm^2$ GHz, and wherein the energy barrier is silicon doped;
   wherein the energy barrier comprises a fully depleted, delta doped electron source layer in proximity with and spaced apart from a fully depleted, delta doped hole source layer by a high field region.

2. A heterojunction transistor according to claim 1 wherein a mole fraction of InN (indium nitride) in an InN/GaN alloy of the energy barrier is in the range of about 4% to about 16%.

3. A heterojunction transistor according to claim 1 wherein a thickness of the energy barrier is in the range of about 0.1 nm to about 10 nm.

4. A heterojunction transistor according to claim 1 further comprising:
   a hole source layer comprising a Group III nitride adjacent the energy barrier such that the energy barrier is between the channel layer and the hole source layer and a hole source region is induced at an interface between the hole source layer and the energy barrier.

5. A heterojunction transistor comprising:
   a channel layer comprising a Group III nitride;
   a barrier layer comprising a Group III nitride on the channel layer wherein the barrier layer has a bandgap greater than a bandgap of the channel layer;
   a gate contact on the barrier layer so that the barrier layer is between the gate contact and the channel layer;
   source and drain contacts on opposite sides of the gate contact;
   an energy barrier comprising a layer of a Group III nitride adjacent the channel layer, wherein the channel layer is between the barrier layer and the energy barrier, wherein the energy barrier has a narrower bandgap than the channel layer, wherein the layer of the Group III nitride of the energy barrier comprises a layer of an InN/GaN alloy, wherein a mole fraction of InN (indium nitride) in the InN/GaN alloy of the energy barrier is in the range of about 1% to about 50%, and wherein the energy barrier is silicon doped; and
   a buffer layer comprising an iron doped Group III nitride, wherein the energy barrier is between the channel layer and the buffer layer;
   wherein the energy barrier comprises a fully depleted, delta doped electron source layer in proximity with and spaced apart from a fully depleted, delta doped hole source layer by a high field region.

6. A heterojunction transistor according to claim 5 wherein a mole fraction of InN (indium nitride) in an InN/GaN alloy of the energy barrier is in the range of about 4% to about 16%.

7. A heterojunction transistor according to claim 5 wherein a thickness of the energy barrier is in the range of about 0.1 nm to about 10 nm.

8. A heterojunction transistor according to claim 5 further comprising:
   a hole source layer comprising a Group III nitride adjacent the energy barrier such that the energy barrier is between the channel layer and the hole source layer and a hole source region is induced at an interface between the hole source layer and the energy barrier.

9. A heterojunction transistor according to claim 5 further comprising:
   a passivation layer on the barrier layer between the gate contact and the source contact and between the gate contact and the drain contact;

wherein the gate contact includes field plate regions extending laterally on surface portions of the passivation layer opposite the substrate towards the source and drain contacts; and a cap layer comprising aluminum gallium nitride on the barrier layer wherein the barrier layer is between the channel layer and the cap layer, wherein the cap layer is between the barrier layer and the gate contact, wherein the cap layer is between the barrier layer and the source contact, and wherein the cap layer is between the barrier layer and the drain contact.

10. A heterojunction transistor according to claim 5 wherein the a buffer layer comprises iron doped gallium nitride.

11. A heterojunction transistor according to claim 5 further comprising:

a hole source layer comprising a Group III nitride adjacent the energy barrier such that the energy barrier is between the channel layer and the hole source layer, wherein a hole source region is induced at an interface between the hole source layer and the energy barrier, and wherein the hole source region is between the energy barrier and the buffer layer.

12. A heterojunction transistor according to claim 11 wherein the barrier layer and the channel layer cooperatively induce a two-dimensional electron gas at an interface between the channel layer and the barrier layer, wherein the energy barrier opposes movement of carriers away from the channel layer, and wherein the energy barrier has a narrower bandgap than the channel layer.

13. A heterojunction transistor according to claim 12 wherein a concentration of Al in the barrier layer is greater than a concentration of Al in the channel layer.

14. The heterojunction transistor according to claim 1 wherein the barrier layer and the channel layer cooperatively induce a two-dimensional electron gas at an interface between the channel layer and the barrier layer, and wherein the energy barrier opposes movement of electrons away from the channel layer.

15. The heterojunction transistor according to claim 14 wherein the channel layer comprises $Al_xGa_{1-x}N$ ($0 \leq x \leq 1$), wherein the barrier layer comprises $Al_yGa_{1-y}N$ ($0 < y \leq 1$).

16. The heterojunction transistor according to claim 5 wherein the barrier layer and the channel layer cooperatively induce a two-dimensional electron gas at an interface between the channel layer and the barrier layer, and wherein the energy barrier opposes movement of electrons away from the channel layer.

17. The heterojunction transistor according to claim 16 wherein the channel layer comprises $Al_xGa_{1-x}N$ ($0 \leq x \leq 1$), wherein the barrier layer comprises $Al_yGa_{1-y}N$ ($0 < y \leq 1$).

18. A heterojunction transistor comprising:

a channel layer comprising a Group III nitride;

a barrier layer comprising a Group III nitride on the channel layer wherein the barrier layer has a bandgap greater than a bandgap of the channel layer;

a buffer layer comprising iron doped Group III nitride, wherein the channel layer is between the barrier layer and the buffer layer;

an energy barrier comprising a layer of a Group III nitride including indium adjacent the channel layer such that the channel layer is between the barrier layer and the energy barrier, wherein the energy barrier has a narrower bandgap than the channel layer, and wherein the energy barrier is between the channel layer and the buffer layer; and a hole source layer comprising a Group III nitride adjacent the energy barrier such that the energy barrier is between the channel layer and the hole source layer and a hole source region is induced at an interface between the hole source layer and the energy barrier, and wherein the hole source region is between the energy barrier and the buffer layer;

wherein the channel layer comprises $Al_xGa_{1-x}N$ ($0 \leq x \leq 1$), wherein the barrier layer comprises $Al_yGa_{1-y}N$ ($0 < y \leq 1$), wherein the barrier layer and the channel layer cooperatively induce a two-dimensional electron gas at an interface between the channel layer and the barrier layer, wherein the energy barrier comprises a fully depleted, delta doped electron source layer in proximity with and spaced apart from a fully depleted, delta doped hole source layer by a high field region, and wherein the energy barrier opposes movement of electrons away from the channel layer.

19. A heterojunction transistor according to claim 18 further comprising:

a gate contact on the barrier layer so that the barrier layer is between the gate contact and the channel layer; and source and drain contacts on opposite sides of the gate contact, wherein the source and drain contacts are spaced apart from the gate contact.

20. A heterojunction transistor according to claim 19 wherein the buffer layer comprises iron doped gallium nitride.

21. A heterojunction transistor according to claim 19 wherein the barrier layer comprises aluminum nitride, the heterojunction transistor further comprising:

a cap layer comprising aluminum gallium nitride on the barrier layer wherein the barrier layer is between the channel layer and the cap layer, wherein the cap layer is between the barrier layer and the gate contact, wherein the cap layer is between the barrier layer and the source contact, and wherein the cap layer is between the barrier layer and the drain contact.

22. A heterojunction transistor according to claim 19 further comprising:

a passivation layer on the barrier layer between the gate contact and the source contact and between the gate contact and the drain contact;

wherein the gate contact includes field plate regions extending laterally on surface portions of the passivation layer opposite the substrate towards the source and drain contacts.

23. A heterojunction transistor according to claim 19, wherein the heterojunction transistor comprising the channel layer, the barrier layer, the gate contact, and the source and drain contacts is configured to provide a back confinement value of at least about 0.21 ohm mm² GHz.

24. A heterojunction transistor according to claim 19 wherein the heterojunction transistor comprising the channel layer, the barrier layer, the gate contact, and the source and drain contacts is configured to provide a device resistance of at least about 9 ohm mm.

25. A heterojunction transistor according to claim 19 wherein the heterojunction transistor comprising the channel layer, the barrier layer, the gate contact, and the source and drain contacts is configured to provide at least 50% power added efficiency and at least 7 W/mm output power.

26. A heterojunction transistor according to claim 19 wherein the heterojunction transistor comprising the channel layer, the barrier layer, the gate contact, and the source and drain contacts is configured to provide at least 65% power added efficiency and at least 8 W/mm output power at a frequency of at least 10 GHz.

27. A heterojunction transistor according to claim 23 wherein the heterojunction transistor comprising the channel layer, the barrier layer, the gate contact, and the source and drain contacts is configured to provide the back confinement value of at least approximately 0.21 ohm mm$^2$ GHz with a unity gain frequency of at least about 35 GHz.

28. A heterojunction transistor according to claim 23 wherein the heterojunction transistor comprising the channel layer, the barrier layer, the gate contact, and the source and drain contacts is configured to provide a back confinement value of at least approximately 0.3 ohm mm$^2$ GHz.

29. A heterojunction transistor according to claim 18 wherein the energy barrier is silicon doped.

30. A heterojunction transistor comprising:
a channel layer comprising a Group III nitride;
a barrier layer comprising a Group III nitride on the channel layer wherein the barrier layer has a bandgap greater than a bandgap of the channel layer;
a gate contact on the barrier layer so that the barrier layer is between the gate contact and the channel layer;
source and drain contacts on opposite sides of the gate contact;
an energy barrier comprising a layer of a Group III nitride adjacent the channel layer, wherein the channel layer is between the barrier layer and the energy barrier, wherein the energy barrier has a narrower bandgap than the channel layer, wherein the layer of the Group III nitride of the energy barrier comprises a layer of an InN/GaN alloy, and wherein a mole fraction of InN (indium nitride) in the InN/GaN alloy of the energy barrier is in the range of about 1% to about 50%;
a buffer layer comprising an iron doped Group III nitride, wherein the energy barrier is between the channel layer and the buffer layer; and
a hole source layer comprising a Group III nitride adjacent the energy barrier such that the energy barrier is between the channel layer and the hole source layer, wherein a hole source region is induced at an interface between the hole source layer and the energy barrier, and wherein the hole source region is between the energy barrier and the buffer layer;
wherein the channel layer comprises $Al_xGa_{1-x}N$ ($0 \leq x \leq 1$), wherein the barrier layer comprises $Al_yGa_{1-y}N$ ($0 < y \leq 1$), wherein the barrier layer and the channel layer cooperatively induce a two-dimensional electron gas at an interface between the channel layer and the barrier layer, wherein the energy barrier comprises a fully depleted, delta doped electron source layer in proximity with and spaced apart from a fully depleted, delta doped hole source layer by a high field region, and wherein the energy barrier opposes movement of electrons away from the channel layer.

31. A heterojunction transistor according to claim 30 wherein the energy barrier is silicon doped.

32. A heterojunction transistor comprising:
a channel layer comprising a Group III nitride;
a barrier layer comprising a Group III nitride on the channel layer wherein the barrier layer has a bandgap greater than a bandgap of the channel layer;
a buffer layer comprising iron doped Group III nitride, wherein the channel layer is between the barrier layer and the buffer layer;
an energy barrier comprising a layer of a Group III nitride including indium adjacent the channel layer such that the channel layer is between the barrier layer and the energy barrier, wherein the energy barrier has a narrower bandgap than the channel layer, and wherein the energy barrier is between the channel layer and the buffer layer; and
a hole source layer comprising a Group III nitride adjacent the energy barrier such that the energy barrier is between the channel layer and the hole source layer and a hole source region is induced at an interface between the hole source layer and the energy barrier, and wherein the hole source region is between the energy barrier and the buffer layer;
wherein the channel layer comprises InAlGaN, wherein the barrier layer comprises InAlGaN, wherein the barrier layer and the channel layer cooperatively induce a two-dimensional electron gas at an interface between the channel layer and the barrier layer, and wherein the energy barrier comprises a fully depleted, delta doped electron source layer in proximity with and spaced apart from a fully depleted, delta doped hole source layer by a high field region.

33. A heterojunction transistor comprising:
a channel layer comprising a Group III nitride;
a barrier layer comprising a Group III nitride on the channel layer wherein the barrier layer has a bandgap greater than a bandgap of the channel layer;
a gate contact on the barrier layer so that the barrier layer is between the gate contact and the channel layer;
source and drain contacts on opposite sides of the gate contact;
an energy barrier comprising a layer of a Group III nitride adjacent the channel layer, wherein the channel layer is between the barrier layer and the energy barrier, wherein the energy barrier has a narrower bandgap than the channel layer, wherein the layer of the Group III nitride of the energy barrier comprises a layer of an InN/GaN alloy, and wherein a mole fraction of InN (indium nitride) in the InN/GaN alloy of the energy barrier is in the range of about 1% to about 50%;
a buffer layer comprising an iron doped Group III nitride, wherein the energy barrier is between the channel layer and the buffer layer; and
a hole source layer comprising a Group III nitride adjacent the energy barrier such that the energy barrier is between the channel layer and the hole source layer, wherein a hole source region is induced at an interface between the hole source layer and the energy barrier, and wherein the hole source region is between the energy barrier and the buffer layer;
wherein the channel layer comprises InAlGaN, wherein the barrier layer comprises InAlGaN, wherein the barrier layer and the channel layer cooperatively induce a two-dimensional electron gas at an interface between the channel layer and the barrier layer, and wherein the energy barrier comprises a fully depleted, delta doped electron source layer in proximity with and spaced apart from a fully depleted, delta doped hole source layer by a high field region.

* * * * *

UNITED STATES PATENT AND TRADEMARK OFFICE
CERTIFICATE OF CORRECTION

PATENT NO. : 9,035,354 B2  
APPLICATION NO. : 12/566973  
DATED : May 19, 2015  
INVENTOR(S) : Saxler et al.

Page 1 of 1

It is certified that error appears in the above-identified patent and that said Letters Patent is hereby corrected as shown below:

<u>On Title Page:</u>
Item 56, References Cited, Page 3, OTHER PUBLICATIONS, Left Column, Line 32: Please correct "Sexier et al." to read -- Saxler et al. --

<u>In the Specification:</u>
Column 5, Line 42: Please correct "after &liming" to read -- after forming --

Column 12, Line 19: Please correct " $V(x)=\int_\infty^K E(x)dx$ ," to read -- $V(x) = -\int_{-\infty}^{x} E(x)dx$ --

Column 20, Line 22: Please correct "Control1." to read -- Control2. --

Column 22, Line 10: Please correct "MN" to read -- AlN --

Column 22, Line 38: Please correct "fowled." to read -- formed. --

Signed and Sealed this  
Ninth Day of February, 2016

Michelle K. Lee  
*Director of the United States Patent and Trademark Office*